United States Patent
Weingarten et al.

(10) Patent No.: US 8,850,296 B2
(45) Date of Patent: Sep. 30, 2014

(54) ENCODING METHOD AND SYSTEM, DECODING METHOD AND SYSTEM

(75) Inventors: Hanan Weingarten, Herzelia (IL); Ofir Avraham Kanter, Yokneam Ilit (IL); Avi Steiner, Kiryat Motzkin (IL); Erez Sabbag, Kiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 1280 days.

(21) Appl. No.: 12/651,489

(22) Filed: Jan. 4, 2010

(65) Prior Publication Data

US 2010/0253555 A1   Oct. 7, 2010

Related U.S. Application Data

(60) Provisional application No. 61/166,834, filed on Apr. 6, 2009.

(51) Int. Cl.
*H03M 13/07* (2006.01)
*H03M 13/29* (2006.01)
*H03M 13/15* (2006.01)
*G06F 11/10* (2006.01)

(52) U.S. Cl.
CPC ...... *H03M 13/2918* (2013.01); *H03M 13/2906* (2013.01); *H03M 13/1565* (2013.01); *H03M 13/152* (2013.01); *G06F 11/1068* (2013.01)
USPC ......................................................... 714/781

(58) Field of Classification Search
CPC ...................................................... H03M 13/09
USPC ......................................................... 714/781
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,701,885 A * | 10/1987 | McElroy | 365/51 |
| 4,777,589 A | 10/1988 | Boettner et al. | |
| 4,866,716 A | 9/1989 | Weng | |
| 4,875,190 A * | 10/1989 | Sakano | 365/189.04 |
| 5,003,597 A | 3/1991 | Merkle | |
| 5,077,737 A | 12/1991 | Leger et al. | |
| 5,280,445 A * | 1/1994 | Shieh et al. | 365/175 |
| 5,297,153 A | 3/1994 | Baggen et al. | |
| 5,305,276 A | 4/1994 | Uenoyama | |

(Continued)

FOREIGN PATENT DOCUMENTS

WO   WO2009053963 A2   4/2009

OTHER PUBLICATIONS

Search Report of PCT Patent Application WO 2009/118720 A3.
Search Report of PCT Patent Application WO 2009/095902 A3.

(Continued)

*Primary Examiner* — Amine Riad
(74) *Attorney, Agent, or Firm* — Dentons US LLP

(57) ABSTRACT

A decoder, an encoder, a decoding method and an encoding method are provided. The encoding method includes receiving data; generating a set of first codewords by applying a first encoding process on the received data; and performing a second encoding process on a folded version of each first codeword to provide a set of second codewords, wherein a folded version of a first codeword is representative of a storage of the first codeword in a two dimensional memory space, wherein the second codeword comprises redundancy bits.

153 Claims, 22 Drawing Sheets

(56) References Cited

U.S. PATENT DOCUMENTS

| | | |
|---|---|---|
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 * | 3/2013 | Ordentlich et al. ............ 714/763 |
| 8,417,893 B2 | 4/2013 | Khmelnitsky et al. |
| 8,700,970 B2 * | 4/2014 | Steiner et al. ................ 714/755 |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |

(56) References Cited

U.S. PATENT DOCUMENTS

| | | |
|---|---|---|
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1* | 5/2007 | Gordon .................... 375/240.12 |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1* | 9/2011 | Steiner et al. ................. 714/746 |
| 2011/0214039 A1* | 9/2011 | Steiner et al. ................. 714/797 |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1* | 1/2012 | Ordentlich et al. ........... 714/763 |
| 2012/0051144 A1 | 3/2012 | Weingarten et al. |
| 2012/0063227 A1 | 3/2012 | Weingarten et al. |

(56) References Cited

U.S. PATENT DOCUMENTS

| | | | |
|---|---|---|---|
| 2012/0066441 | A1 | 3/2012 | Weingarten |
| 2012/0110250 | A1 | 5/2012 | Sabbag et al. |
| 2012/0124273 | A1 | 5/2012 | Goss et al. |
| 2012/0246391 | A1 | 9/2012 | Meir et al. |

OTHER PUBLICATIONS

Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", IEEE Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", IEEE Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit Cell NROM reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

ENCODING METHOD AND SYSTEM, DECODING METHOD AND SYSTEM

REFERENCE TO RELATED APPLICATIONS

This application claims the benefit of U.S. Provisional Patent Application No. 61/166,834, filed Apr. 6, 2009, the entire contents of which are incorporated herein by reference.

FIELD OF THE INVENTION

The present invention relates to an encoding method, a decoding method, a system that has encoding capabilities and a system that has decoding capabilities.

BACKGROUND OF THE INVENTION

A code rate is defined by the ratio of its information content to the overall size of the codeword. For example, for a code that contains k bits and r redundancy bits that rate is defined by k/(k+r). The common encoding methods are not very well suited to support high rate codes when both hard and soft decoding are considered. For example, for conventional low-density parity-check (LDPC codes) for very high rates (for example—0.95) the code length tends to be considerable resulting in a very complex and costly implementation.

SUMMARY OF EMBODIMENTS OF THE INVENTION

BCH and RS (Reed-Solomon) are among the most widely used cyclic error correcting codes. They are used in various practical fields such as storage and communication. When these coding schemes are used in mobile applications, power consumption is a major design constraint which sometimes even affects the actual viability of the applicability of the schemes to the mobile applications.

The apparatus according to embodiments of the invention may include a flash memory that stores data encoded in accordance with a Reed-Solomon decoding algorithm and wherein the stored data is Reed-Solomon decoded by a decoder that comprises at least the first and second hardware circuits.

The apparatus according to embodiments of the invention may include a flash memory to store data encoded in accordance with a BCH encoding algorithm and a BCH decoder.

An encoding method is provided. The method may include: receiving data; generating a set of first codewords by applying a first encoding process on the received data; and performing a second encoding process on a folded version of each first codeword to provide a set of second codewords, wherein a folded version of a first codeword is representative of a storage of the first codeword in a two dimensional memory space, wherein first and second sets of codewords facilitate an error correction encoding of the data.

The method may include, according to an embodiment of the invention, storing each first codeword in multiple columns of a memory space; and performing the second encoding process on rows of the memory space.

The method may include, according to an embodiment of the invention, wherein the first error encoding process differs from the second encoding process.

The method may include, according to an embodiment of the invention, wherein at least two first codewords have different lengths.

The method may include, according to an embodiment of the invention, configuring an error correction capability of at least one of the first and second encoding processes based on a desired error correction capability.

The method may include, according to an embodiment of the invention, performing a third encoding process on a folded version of each second codeword to provide a set of third codewords, wherein a folded version of a second codeword is representative of storage of the second codeword in a two dimensional memory space.

The first, second and third error encoding processes may differ from each other. It is noted that the number of encoding processes can be higher than 3 or 4.

At least two codewords out of different sets of codewords may have different lengths.

At least two codewords of the same set of codewords may have different lengths.

The method may include, according to an embodiment of the invention, performing at least four encoding processes, wherein each encoding process except a first encoding process is applied on a folded version of a set of codewords obtained by applying a previous encoding process.

A method can be provided. The method may include applying every encoding process by encoding the whole data stream generated by all previous encoding processes (thus encoding systematic and redundancy bits).

A method can be provided. The method may include encoding by multiple encoding processes only systematic bits, and applying an additional encoding process (applying a different code) for the redundancy bits created by all encoding processes.

The method may include, according to an embodiment of the invention, performing at least three encoding processes, wherein each encoding process except a first encoding process is applied on a folded version of a set of codewords obtained by applying a previous encoding process, wherein at least one encoding process is applied only on redundancy bits generated by previous encoding processes.

The method may include, according to an embodiment of the invention, performing at least three encoding processes, wherein each encoding process—may be applied on a folded version of a set of codewords obtained by jointly encoding multiple rows/columns, wherein at least two encoding processes differ from each other (can be identical). Every two encoding processes may operate on a partially different sub-set of the input bits.

The method may include, according to an embodiment of the invention, generating the set of first codewords by a first encoder, providing the first codewords to a second encoder, and performing a second encoding process by a second encoder; wherein the second encoder starts to perform the second encoding process before the first encoder finished to generate a sub-set of the first codewords.

The method may include, according to an embodiment of the invention, generating the set of first codewords by a first linear feedback shift register of the first encoder, providing first codeword chunks to a second linear feedback shift register of the second encoder, and performing a second encoding process by a second encoder.

Each first codeword may be arranged in a set of consecutive columns of a matrix; and the method may include filling registers that correspond to rows of the matrix and performing the second decoding process on rows of the matrix.

The method may include, according to an embodiment of the invention, generating the set of first codewords by a first encoder, wherein a folded version of a first codeword is arranged in a set of consecutive columns of a matrix; filling registers of a second encoder, wherein the registers correspond to rows of the matrix and performing the second encoding process on rows of the matrix by the second encoder.

The method may include, according to an embodiment of the invention, configuring configurable linear feedback shift registers according to an encoding parameter of an encoding process selected from the first and second encoding processes.

The method may include, according to an embodiment of the invention, storing the set of second codewords in a flash memory; reading a content of the flash memory; and applying a decoding process on the content of the flash memory.

A decoding method, that includes: receiving information that comprises a final set of codewords that had undergone an error inducing process; reconstructing data by applying on the information a first decoding process to provide first results; and applying a second decoding process on folded versions of first results to provide second results; wherein a folded version of a first result is representative of a storage of the first result in a two dimensional memory space.

The method may include, according to an embodiment of the invention, storing each first result in multiple columns of a memory space; and performing the second decoding process on rows of the memory space.

The first error encoding process may differ from the second encoding process.

The method may include, according to an embodiment of the invention, configuring an error correction capability of at least one of the first and second decoding processes based on the required (also referred to as a desired) error correction capability.

The method may include, according to an embodiment of the invention, performing a third decoding process on a folded version of each second result to provide a set of third results, wherein a folded version of a second result is representative of storage of the second result in a two dimensional memory space.

The first, second and third error decoding processes may differ from each other.

At least two results out of different sets of results may have different lengths.

At least two results of the same set of result may have different lengths.

The method may include, according to an embodiment of the invention, performing at least four decoding processes, wherein each decoding process except a first decoding process is applied on a folded version of a set of results obtained by applying a previous decoding process. It is noted that each of the mentioned above encoding or decoding processes are applied on folded versions of the input data.

The method may include, according to an embodiment of the invention, performing at least three decoding processes, wherein each decoding process except a first decoding process is applied on a folded version of a set of results obtained by applying a previous decoding process, wherein at least one decoding process is applied only on redundancy bits generated by previous decoding processes.

The method may include, according to an embodiment of the invention, performing at least three decoding processes, wherein each decoding process except a first decoding process is applied on a folded version of a set of results obtained by applying a previous decoding process, wherein at least two decoding processes differ from each other.

The method may include, according to an embodiment of the invention, performing at least two decoding processes, wherein at least one decoding process is followed by determining whether to ignore the results of the decoding process.

The method may include, according to an embodiment of the invention, ignoring the results of an ignored decoding process by applying a next decoding process on a folded version of each result of a decoding process that preceded the ignored decoding process.

The method may include, according to an embodiment of the invention, determining to ignore the results of the decoding process if detecting a miss correction. A miss correction occurs when a decoder amends correct data. A miss correction may be detected if a decoder can identify its inability to correct errors in the input codeword.

The method may include, according to an embodiment of the invention, ignoring the results of the first decoding process by applying the second decoding process on a folded version of the information.

The method may include, according to an embodiment of the invention, performing at least two decoding processes, wherein at least one decoding process is followed by determining whether to skip at least one decoding process that follows the decoding process.

The method may include, according to an embodiment of the invention, determining to skip at least one decoding process if at least one decoding process that preceded the determination provided a result of a desired characteristic.

The method may include, according to an embodiment of the invention, ignoring the results of an ignored decoding process by applying a next decoding process on a folded version of each result of a decoding process that preceded the ignored decoding process.

The method may include, according to an embodiment of the invention, preventing a modification of at least one bit of a result by at least one decoding process if determined by at least one preceding decoding process that the at least one bit is correct.

The method may include, according to an embodiment of the invention, performing an error location search of a decoding process in response to error locations that were found during a previous decoding process.

The method may include, according to an embodiment of the invention, generating, for each information bit out of multiple information bits, multiple indications about a correctness of the information bit, wherein the generating comprises applying multiple decoding processes out of a group of information bits; and determining whether to modify each information bit based upon multiple indications associated with the information bit.

The method may include, according to an embodiment of the invention, generating, for each information bit out of multiple information bits, multiple indications about a correctness of the information bit, wherein the generating comprises applying multiple decoding processes out of a group of information bits; and determining whether to modify each information bit based upon a majority of indications associated with the information bit.

The method may include, according to an embodiment of the invention, generating, for each information bit out of multiple information bits, multiple indications about a correctness of the information bit, wherein the generating comprises applying multiple decoding processes out of a group of information bits; and determining to modify each information bit if at least a predetermined number of indications associated with the information bit indicate that the bit should be modified.

The method may include, according to an embodiment of the invention, generating, for each information bit out of multiple information bits, multiple indications about a correctness of the information bit, wherein the generating comprises applying multiple decoding processes out of a group of information bits; and determining whether to modify each information bit based upon confidence levels of different indications associated with the information bit.

Each decoding process may be characterized by correction threshold; wherein the method comprises preventing a modification of information bits if a decoding process indicates that errors occurred in more information bits than the correction threshold of the decoding process.

The method may include, according to an embodiment of the invention, performing multiple iterations of multiple decoding processes.

The method may include, according to an embodiment of the invention, performing an iteration of multiple decoding processes while allowing a correction of up to a predefined number of corrections; altering the predefined number of corrections; and performing another iteration of multiple decoding processes while allowing a correction of up to an altered predefined amount of corrections.

The method may include, according to an embodiment of the invention, performing multiple iterations of decoding processes to provide multiple decoding iteration results; wherein the decoding iterations differ from each other; and selecting a selected decoding iteration result out of the multiple decoding iterations results.

The method may include, according to an embodiment of the invention, performing a first iteration of decoding processes to provide a first decoding iteration result; and performing a second iteration of second processes if the first decoding iteration result does not satisfy a predefined criteria.

The method may include, according to an embodiment of the invention, performing a first iteration of decoding processes to provide a first decoding iteration result; and performing a second iteration of second processes if the first decoding iteration failed.

The method may include, according to an embodiment of the invention, performing multiple iterations of decoding processes wherein at least one iteration of decoding processes comprises multiple instances of a single decoding process.

A system may be provided. The system may include an encoding unit and a two dimensional memory array; wherein the encoding unit may be configured to receive data; generate a set of first codewords by applying a first encoding process on the received data; and perform a second encoding process on a folded version of each first codeword to provide a set of second codewords, wherein a folded version of a first codeword is representative of a storage of the first codeword in a two dimensional memory space, wherein the set of second codewords facilitates an error correction encoding of the data.

According to an embodiment of the invention the two dimensional memory array may be configured to store each first codeword in multiple columns of the two dimensional memory array; and wherein the encoding unit may be configured to perform the second encoding process on rows of the two dimensional memory array.

According to an embodiment of the invention the first encoding process differs from the second encoding process.

According to an embodiment of the invention at least two first codewords have different lengths.

According to an embodiment of the invention the encoding unit is configured to adjust an error correction capability of at least one of the first and second encoding processes based on a desired error correction capability.

According to an embodiment of the invention the encoding unit may be configured to perform a third encoding process on a folded version of each second codeword to provide a set of third codewords, wherein a folded version of a second codeword is representative of a storage of the second codeword in a two (or three) dimensional memory space.

According to an embodiment of the invention the encoding unit is configured to perform first, second and third encoding processes that differ from each other. It is noted that the different encoding processes may be the same.

According to an embodiment of the invention at least two codewords out of different sets of codewords have different lengths. This is not necessarily so and the length can also be the same.

According to an embodiment of the invention at least two codewords of the same set of codeword have different lengths. This is not necessarily so and the length can also be the same.

According to an embodiment of the invention the encoding unit may be configured to perform at least four encoding processes, wherein the encoding unit may be configured to perform each encoding process except a first encoding process is applied on a folded version of a set of codewords obtained by applying a previous encoding process. The encoding unit may apply encoding processes on folded versions of the input data. The encoding unit may apply an encoding process that encodes the whole data stream (encoding results and input data) generated by all previous encoding processes (thus encoding systematic and redundancy bits). In another embodiment, the encoding unit encodes only systematic bits by every encoding process, and applies an additional code for encoding the redundancy bits created by all encoding processes.

According to an embodiment of the invention encoding unit may be configured to perform at least three encoding processes, wherein the encoding unit may be configured to apply each encoding process except a first encoding process on a folded version of a set of codewords obtained by applying a previous encoding process, wherein the encoding unit may be configured to apply at least one encoding process only on redundancy bits generated by previous encoding processes.

According to an embodiment of the invention the encoding unit may be configured to perform at least three encoding processes, wherein each encoding process except a first encoding process is applied on a folded version of a set of codewords obtained by applying a previous encoding process, wherein at least two encoding processes differ from each other.

According to an embodiment of the invention the encoding unit comprises a first encoder and a second encoder; wherein the first encoder may be configured to generate the set of first codewords, provide the first codewords to the second encoder, and wherein the second encoder may be configured to perform a second encoding process; wherein the second encoder starts to perform the second encoding process before the first encoder finished to generate a sub-set of the first codewords.

According to an embodiment of the invention a first linear feedback shift register of the first encoder may be configured to generate the set of first, provide first codeword chunks to a second linear feedback shift register of the second encoder, and wherein the second encoder performs the second encoding.

According to an embodiment of the invention each first codeword is arranged in a set of consecutive columns of a matrix (if a single codeword captures more than one column the codeword is said to be folded); wherein the encoding unit comprises a second encoder that comprises registers correspond to rows of the matrix; wherein the second encoder may be configured to fill these registers and process the content of the registers.

According to an embodiment of the invention the encoding unit comprises a first encoder and a second encoder; wherein the first encoder may be configured to generate the set of first codewords, wherein a folded version of a first codeword is arranged in a set of consecutive columns of a matrix; wherein the second encoder comprises registers that correspond to rows of the matrix; wherein the second encoder may be configured to perform the second encoding process on rows of the matrix by the second encoder.

According to an embodiment of the invention the encoding unit comprises multiple configurable linear feedback shift registers that are configurable according to an encoding parameter of an encoding process selected from the first and second encoding processes.

According to an embodiment of the invention the system includes a flash memory configured to store the set of second codewords in a flash memory; and a memory controller configured to read a content of the flash memory; wherein the decoding unit may be configured to applying multiple decoding processes on the content of the flash memory.

A system may include a decoder and a two dimensional memory unit, the decoder is configured to receive information that comprises a final set of codewords that undergone an error inducing process; reconstruct data by applying on the information a first decoding process to provide first results; and apply a second decoding process on folded versions of first results to provide second results; wherein a folded version of a first result is representative of a storage of the first result in a two dimensional memory space.

According to an embodiment of the invention the two dimensional memory unit is configured to store each first result is stored in multiple columns; wherein the decoder is configured to perform the second decoding process on rows of the two dimensional memory unit.

According to an embodiment of the invention the first error encoding process differs from the second encoding process.

According to an embodiment of the invention at least two first results have different lengths.

According to an embodiment of the invention the decoder is configured to apply decoding processes of configurable error correction capability; wherein the configurable error correction capabilities are determined based on a desired error correction capability.

According to an embodiment of the invention decoder is adapted perform a third decoding process on a folded version of each second result to provide a set of third results, wherein a folded version of a second result is representative of a storage of the second result in a two dimensional memory space.

According to an embodiment of the invention the first, second and third error decoding process differ from each other but may be equal to each other.

According to an embodiment of the invention at least two results out of different sets of results have different lengths but may be equal.

According to an embodiment of the invention at least two results of the same set of result have different lengths.

According to an embodiment of the invention the decoder is configured to perform at least four decoding processes, wherein each decoding process except a first decoding process is applied on a folded version of a set of results obtained by applying a previous decoding process.

According to an embodiment of the invention the decoder is configured to perform at least three decoding processes, wherein the decoder is configured to apply each decoding process except a first decoding process on a folded version of a set of results obtained by applying a previous decoding process, wherein the decoder is configured to apply at least one decoding process only on redundancy bits generated by previous decoding processes.

According to an embodiment of the invention the decoder is configured to perform at least three decoding processes, wherein the decoder is configured to apply each decoding process except a first decoding process on a folded version of a set of results obtained by applying a previous decoding process, wherein at least two decoding processes differ from each other.

According to an embodiment of the invention the decoder is configured to perform at least two decoding processes, wherein the decoder is configured to determine, after completing at least one decoding process, whether to ignore the results of the decoding process.

According to an embodiment of the invention the decoder is configured to ignore the results of an ignored decoding process by applying a next decoding process on a folded version of each result of a decoding process that preceded the ignored decoding process.

According to an embodiment of the invention the decoder is configured to determine to ignore the results of the decoding process if detecting a miss correction.

According to an embodiment of the invention the decoder is configured to ignore the results of the first decoding process by applying the second decoding process on a folded version of the information.

According to an embodiment of the invention the decoder is configured to perform at least two decoding processes and to determine whether to skip at least one decoding process that follows a decoding process.

According to an embodiment of the invention the decoder is configured to perform at least two decoding processes and to determine whether to skip at least one decoding process that follows a decoding process if at least one decoding process that preceded the determination provided a result of a desired characteristic.

According to an embodiment of the invention the decoder is configured to ignore the results of an ignored decoding process and to apply a next decoding process on a folded version of each result of a decoding process that preceded the ignored decoding process.

According to an embodiment of the invention the decoder is configured to prevent a modification of at least one bit of a result by at least one decoding process if the decoder determines, by applying at least one preceding decoding process that the at least one bit is correct.

According to an embodiment of the invention the decoder is configured to perform an error location search of a decoding process in response to error locations that were found during a previous decoding process.

According to an embodiment of the invention the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit based upon multiple indications associated with the information bit.

According to an embodiment of the invention the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit based upon a majority of indications associated with the information bit. The decoder may compare the number of correct indications per bit with a threshold.

According to an embodiment of the invention the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit if at least a predetermined number of indications associated with the information bit indicate that the bit should be modified.

According to an embodiment of the invention the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit based upon confidence levels of different indications associated with the information bit.

According to an embodiment of the invention each decoding process is characterized by correction threshold; wherein the decoder is configured to prevent a modification of information bits if a decoding process indicates that errors occurred in more information bits than the correction threshold of the decoding process.

According to an embodiment of the invention the decoder is configured to perform multiple iterations of multiple decoding processes.

According to an embodiment of the invention the decoder is configured to perform an iteration of multiple decoding processes while allowing a correction of up to a predefined number of corrections; alter the predefined number of corrections; and perform another iteration of multiple decoding processes while allowing a correction of up to an altered predefined amount of corrections.

According to an embodiment of the invention the decoder may be configured to perform multiple iterations of decoding processes to provide multiple decoding iteration results; wherein the decoding iterations differ from each other; and select a selected decoding iteration result out of the multiple decoding iterations results.

According to an embodiment of the invention the decoder may be configured to perform a first iteration of decoding processes to provide a first decoding iteration result; and perform a second iteration of second processes if the first decoding iteration result does not satisfy a predefined criterion.

According to an embodiment of the invention the decoder may be configured to perform a first iteration of decoding processes to provide a first decoding iteration result; and perform a second iteration of second processes if the first decoding iteration failed.

According to an embodiment of the invention the decoder may be configured to perform multiple iterations of decoding processes wherein at least one iteration of decoding processes comprises multiple instances of a single decoding process.

The method according to embodiments of the invention may include retrieving data stored in a flash memory and performing Reed-Solomon decoding.

The method according to embodiments of the invention may comprise of retrieving data stored in a flash memory and performing BCH decoding per decoding process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A folded version of a codeword is representation of the codeword as being stored in a two or higher-dimensional space. Thus, the folded version of the codeword represents a storage of the codeword as being stored in more than a single row and more than a single column.

Figure 1A:
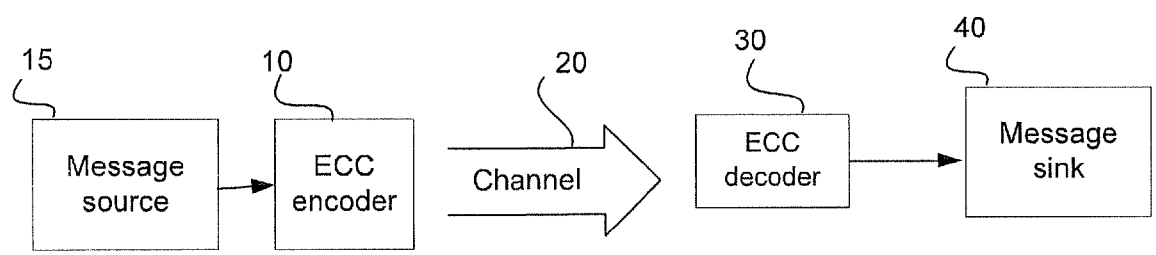
FIG. 1A is a simplified functional block diagram of an encoding/decoding system according to an embodiment of the invention.

Reference is now made to FIG. 1A which is a simplified functional block diagram of an encoding/decoding system that includes an encoder and a decoder in accordance with certain embodiments of the present invention.

In FIG. 1A, message source 15 provides a message m(x) which it may be desired to transmit or to store, e.g. in flash memory, to Error Correction Coding (ECC) encoder 10. ECC encoder 10 may include BCH or Reed-Solomon cyclic error correction coding apparatus and is typically operative for computing and for adding, to the message m(x), redundancy bits, thereby to generate a codeword c(x) of a known codebook such as BCH or Reed-Solomon with known parameters. Channel 20, which may include any medium through which the message is conveyed from ECC encoder 10 to ECC decoder 30. Channel 20 adds errors e(x) to the codeword c(x). It is noted that e(x) may represent an addition of thermal noise, which means that the vector r(x) can be, in general, a vector of real values. ECC encoder 10 can be included in a transmitter while ECC decoder 30 is included in a receiver. There may be two main types of vector e(x): 1) Bit error-vector—this is the case of single read from the memory, and decoding is called hard decoding. 2) Noise vector—a result of multiple reads, can be an integer in a finite range depending on the number of read operations. The decoding may be soft decoding.

The errors may stem from various physical processes such as thermal noise, deterioration of storage medium over time and, especially after many read/write operations, inaccuracies in the transmitter or receiver hardware. Each error occurs at a particular location within the message, which is assumed to comprise a sequence of bits or of symbols. In the former case, binary BCH code is typically used for encoding and decoding, whereas in the latter case, non-binary BCH code, or RS code is used. In the first, binary, instance, n is used in the foregoing discussion to indicate a bit of the data being read or received in which an error has occurred. In the second, non-binary, instance, n is used in the foregoing discussion to indicate a symbol of the data being read or received in which an error has occurred.

The received data r(x) equals the following: r(x)=c(x)+e(x). Received data r(x) is typically received by an error correcting decoder 130, also termed herein the "receiver". ECC decoder 130, using the redundancy that was added to the message and the known codebook, is operative to substantially reconstruct the original message m'(x) and convey it to the intended target, message sink 140.

Figure 1B:
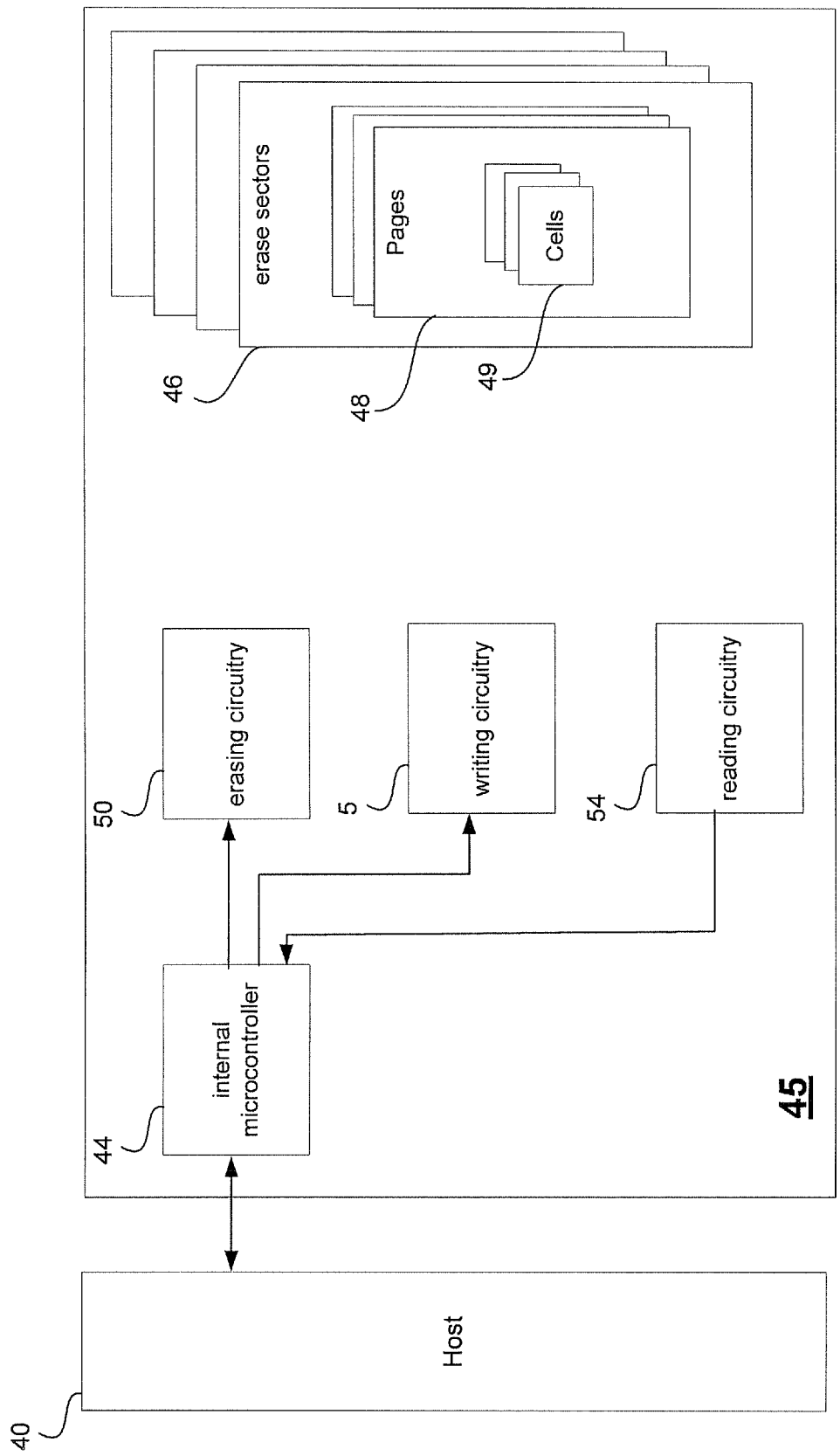
FIG. 1B is a simplified functional block diagram of a flash memory apparatus according to an embodiment of the invention.

FIG. 1B is a simplified functional block diagram of a flash memory apparatus according to an embodiment of the invention. The apparatus includes, in an internal microcontroller 44, the encoding/decoding system of FIG. 1A and particularly the decoder, all operative in accordance with certain embodiments of the present invention. As shown, the flash memory apparatus of FIG. 1B typically interacts with a host 40 and typically includes the microcontroller 44 as well as one or more erase sectors 46 each comprising one or more pages 48 each including cells 49. The microcontroller 44 effects erasing of, writing on and reading from the erase sector/s 46, by suitably controlling erasing circuitry 50, writing circuitry 52 and reading circuitry 54, respectively. According to certain embodiments of the present invention, microcontroller 44 includes an error correction code decoder operative to receive data from the reading circuitry 54, to decode the data, including performing a Chien search for error locations, and to provide the data thus decoded to the host 40 which therefore constitutes both the source and sink of FIG. 1A, in memory applications.

In flash memory applications, the channel 20 generally represents the deterioration in the data stored in memory over time and due to repeated cycling and retention, and the encoding and decoding (functionalities 10 and 30 in FIG. 1A) are performed within one or more suitable controllers e.g. the microcontroller 44 of FIG. 1B which is external to the flash memory device 45 or an external controller operatively associated with the host 40 and external to device 45.

Figure 1C:
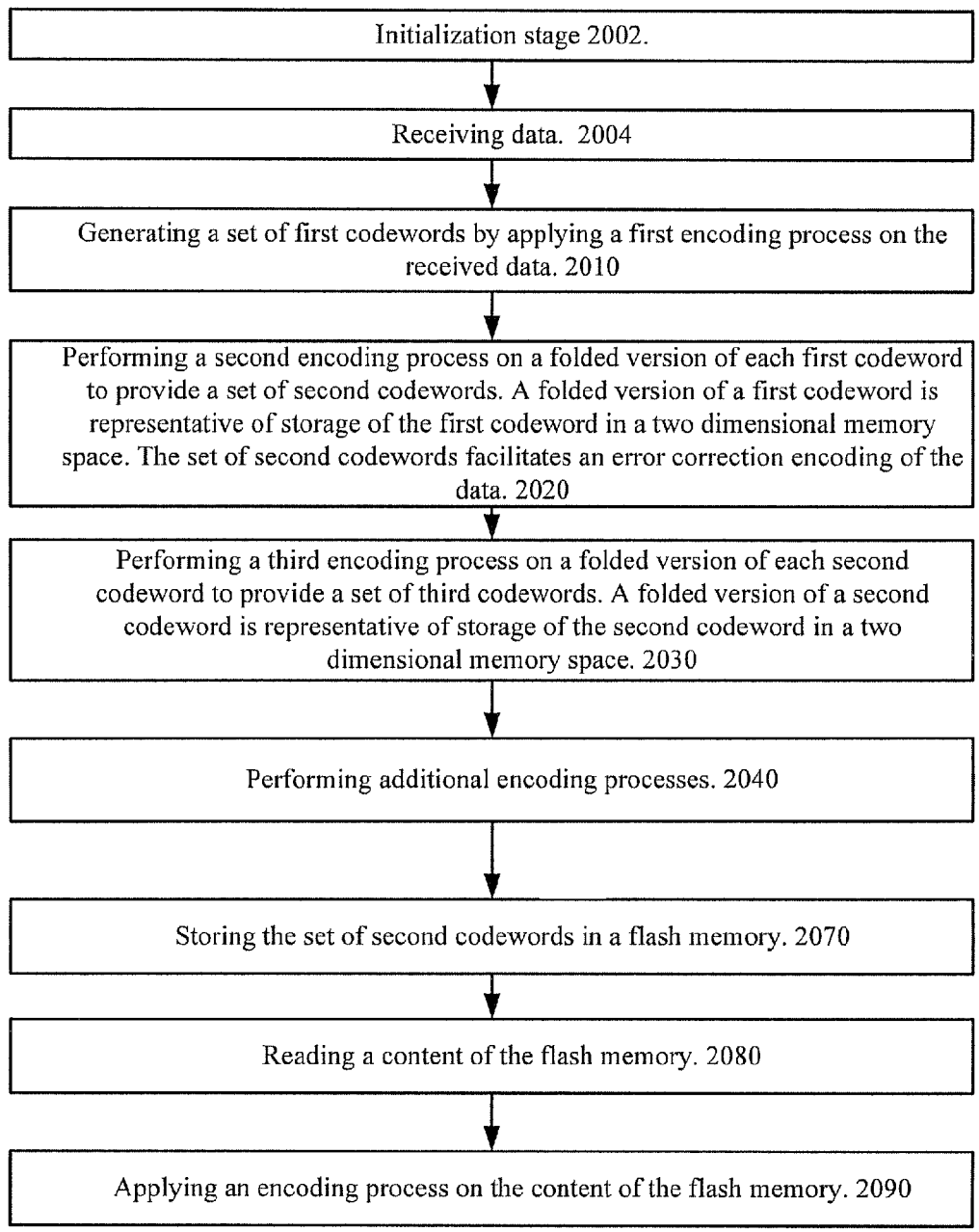
FIG. 1C illustrates an encoding method according to an embodiment of the invention.

FIG. 1C illustrates encoding method 2000 according to an embodiment of the invention.

Method 2000 starts by initialization stage 2002. Stage 2002 may include configuring an error correction capability of at least one of the first and second encoding processes based on a desired error correction capability.

Stage 2002 is followed by stage 2004 of receiving data. The data may also be referred to as data or information.

Stage 2004 is followed by stage 2010 of generating a set of first codewords by applying a first encoding process on the received data.

Figure 2A:
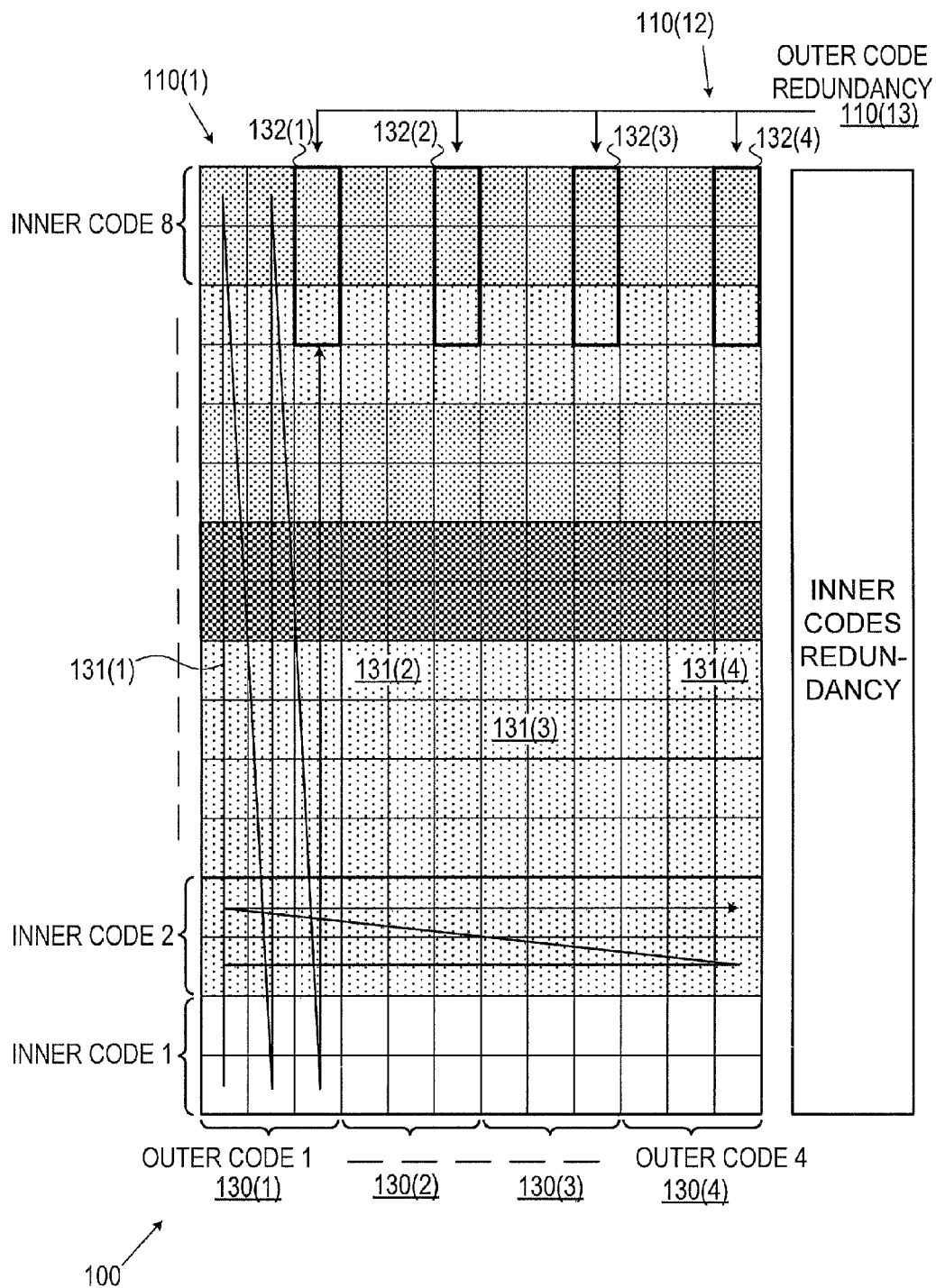
FIG. 2A illustrates a folded two dimensional code, according to an embodiment of the invention.

Stage 2010 is followed by stage 2020 of performing a second encoding process on a folded version of each first codeword to provide a set of second codewords. A folded version of a first codeword is representative of a storage of the first codeword in a two or higher dimensional memory space. The set of second codewords facilitates an error correction encoding of the data. FIG. 2A illustrates a two dimensional folded code that is generated by applying two decoding processes, wherein a second decoding process is applied on a folded version of first codewords. The first codewords are also referred to as outer codes and the second codewords are also referred to as inner codes.

Stage 2010 may include of storing each first codeword in multiple columns of a memory space and stage 2020 may include performing the second encoding process on rows of the memory space.

The first error encoding process may or may not differ from the second encoding process. At least two first codewords may have different lengths.

Figure 6:
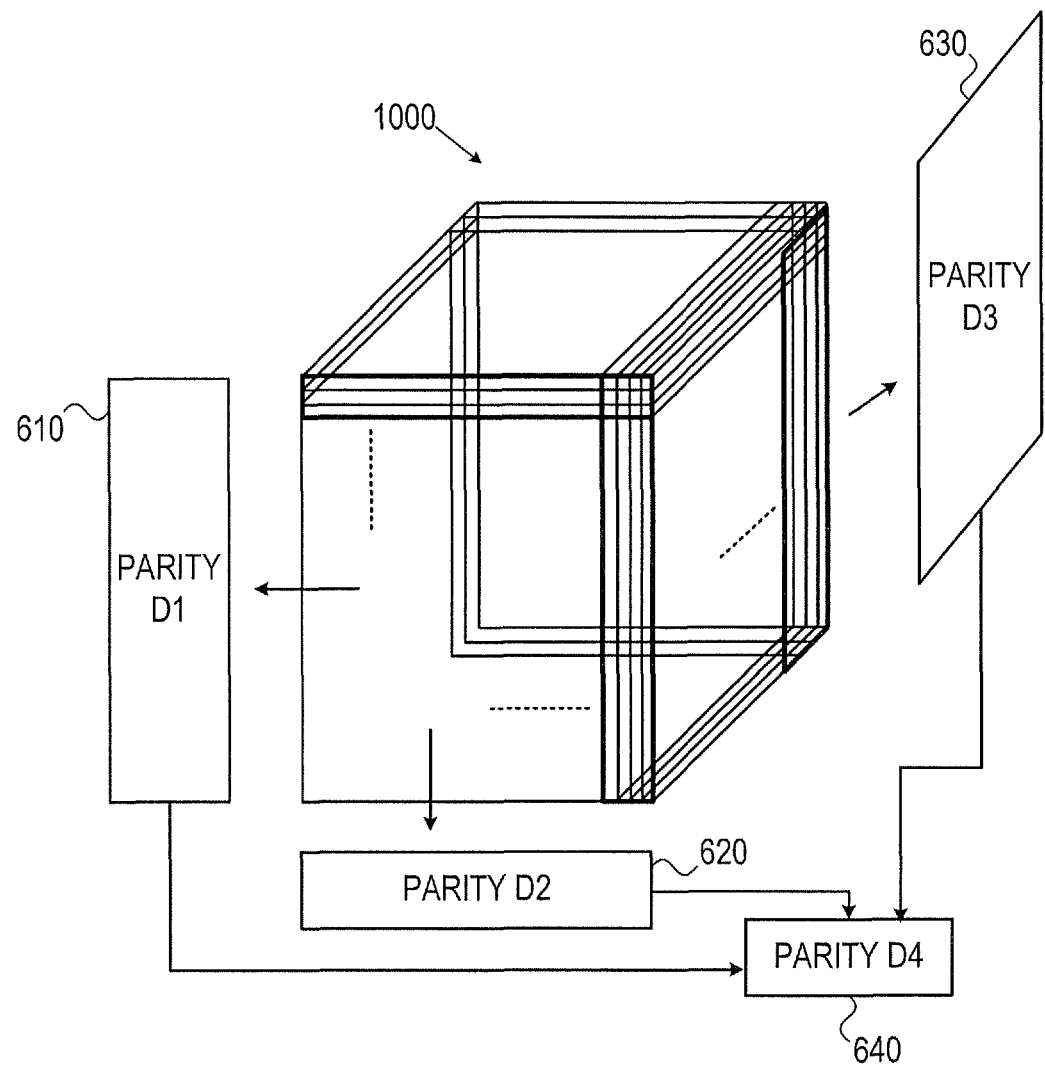
FIG. 6 illustrates 3D encoding, according to an embodiment of the invention.

Stage 2020 may be followed by stage 2030 of performing a third encoding process on a folded version of each second codeword to provide a set of third codewords. A folded version of a second codeword is representative of a storage of the second codeword in a two or higher dimensional memory space. A non-limiting example of a three dimensional folded code that may be generated by stages 2010, 2020 and 2030 is illustrated in FIG. 6.

The first, second and third error encoding process may differ from each other. At least two codewords of the same set of codeword may have different lengths.

Method 2000 can include performing additional encoding processes, as illustrated by stage 2040 denoted "performing additional encoding processes".

Method 2000 may include performing at least four encoding processes, wherein each encoding process except a first encoding process is applied on a folded version of a set of codewords obtained by applying a previous encoding process. The first encoding process is applied on the raw data. It is noted that folding depends on whether or not a codeword captures more than a single column/row, etc. There may be multiple (M) encoding processes, wherein M may differ from 4.

Figure 4:
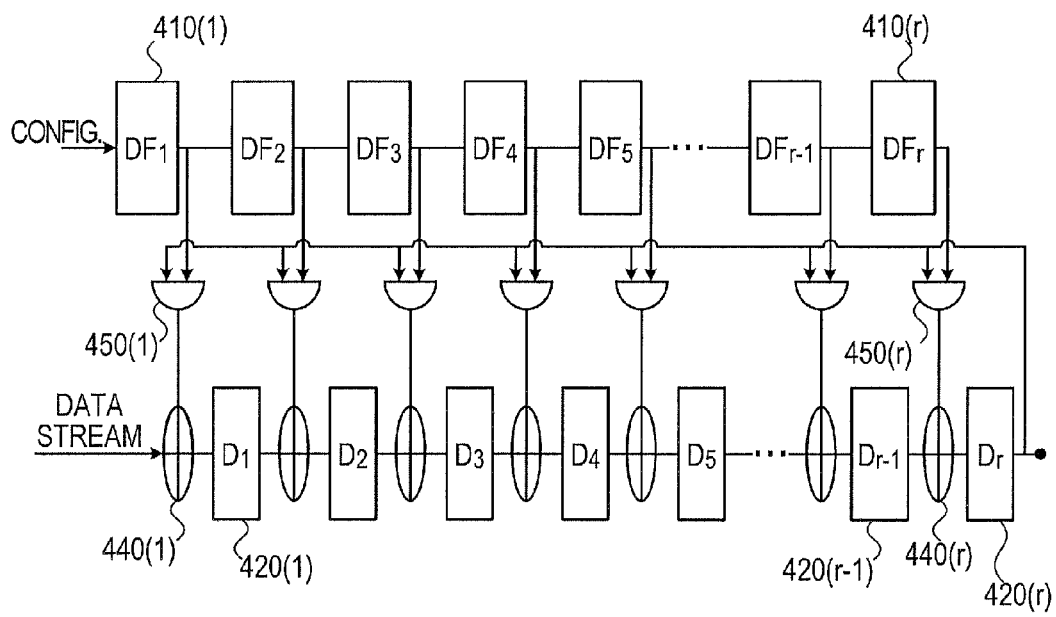
FIG. 4 illustrates a configurable linear feedback encoder shift register, according to an embodiment of the invention.

Method 2000 can include performing at least three encoding processes, wherein each encoding process except a first encoding process is applied on a folded version of a set of codewords obtained by applying a previous encoding process, wherein at least one encoding process is applied only on redundancy bits generated by previous encoding processes. FIG. 4 illustrates a fourth decoding process that is applied only on parity bits generated by applying three previous decoding processes.

Method 2000 may include performing at least three encoding processes, wherein each encoding process except a first encoding process is applied on a folded version of a set of codewords obtained by applying a previous encoding process, wherein at least two encoding processes differ from each other.

Figure 2B:
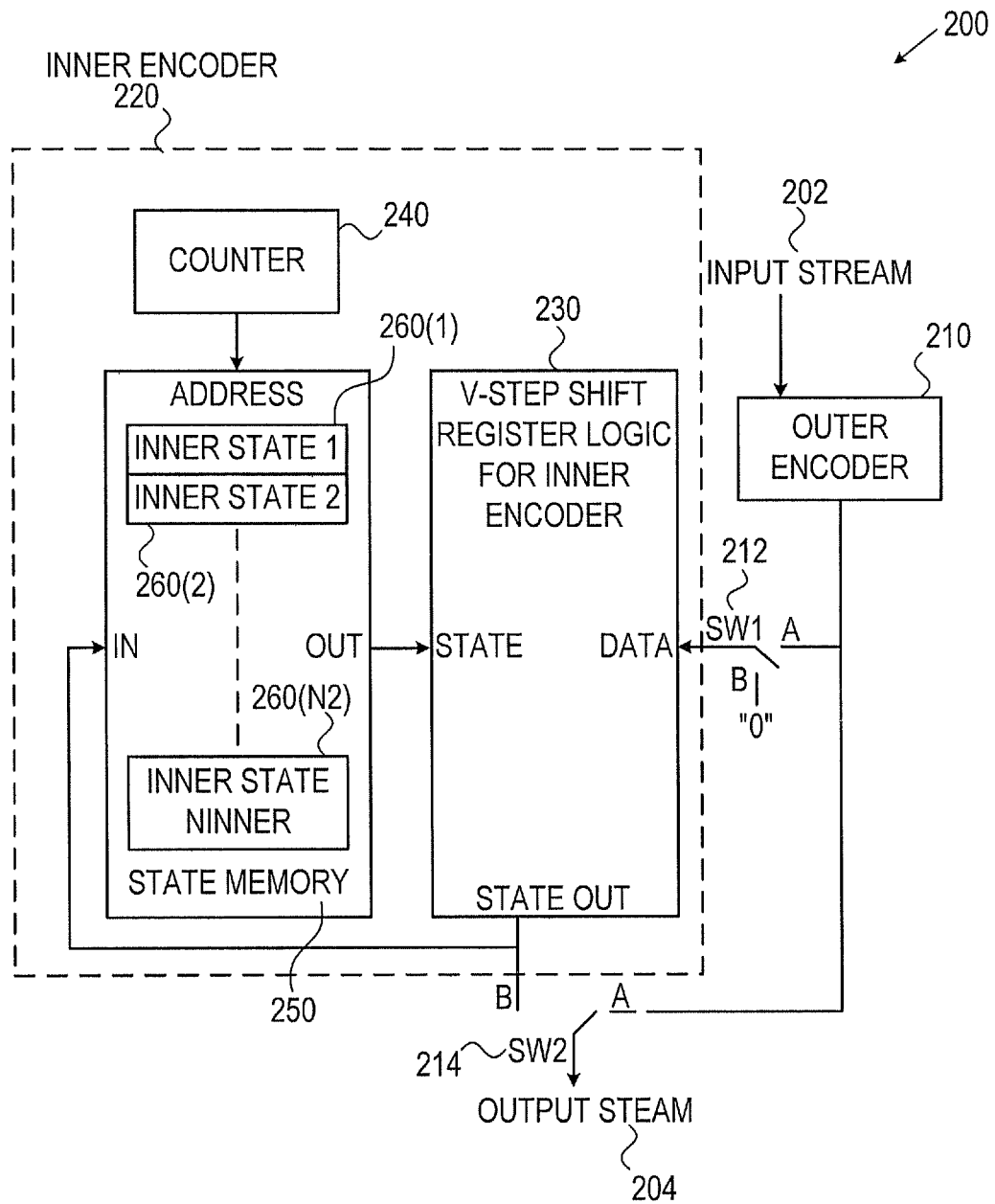
FIG. 2B illustrates a two dimensional BCH encoder, according to an embodiment of the invention.

Stage 2010 can be executed by a first encoder. Stage 2010 may also include providing the first codewords to a second encoder. Stage 2020 may be executed by the second encoder. The second encoder may start to perform the second encoding process before the first encoder finished to generate a sub-set of the first codewords. FIG. 2B provides a non-limiting example of an encoding unit that includes two encoders that operate substantially in parallel to each other.

Figure 3:
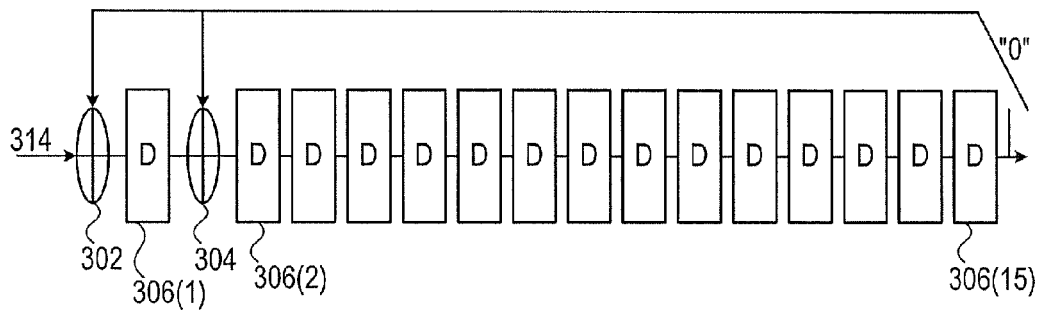
FIG. 3 illustrates a 1-Error correction linear feedback shift register, according to an embodiment of the invention.

Stage 2010 may include generating the set of first codewords by a first linear feedback shift register of the first encoder and may include providing first codeword chunks to a second linear feedback shift register of the second encoder. Stage 2020 may include performing a second encoding process by a second encoder. FIG. 2B provides a non-limiting example of an encoding unit that includes two encoders—each having its own linear feedback shift register. Non-limiting examples of linear feedback shift registers are provided in FIG. 3 and FIG. 4.

Each first codeword may (but not limited to) be arranged in a set of consecutive columns of a matrix. Stage 2020 may include filling registers that correspond to rows of the matrix and performing the second decoding process on rows of the matrix. FIG. 2B provides a non-limiting example of an encoding unit that includes a second encoder that includes multiple registers that are filled in a sequential manner and eventually store rows of the matrix.

Stage 2090 can include configuring a configurable linear feedback shift register according to an encoding parameter of an encoding process selected from the first and second encoding processes. A Non limiting example of a configurable linear feedback shift register is included in FIG. 4.

Method 2000 may include stage 2070 of storing the set of second codewords in a flash memory, stage 2080 of reading a content of the flash memory, and stage 2090 of applying a encoding process on the content of the flash memory.

Figure 1D:
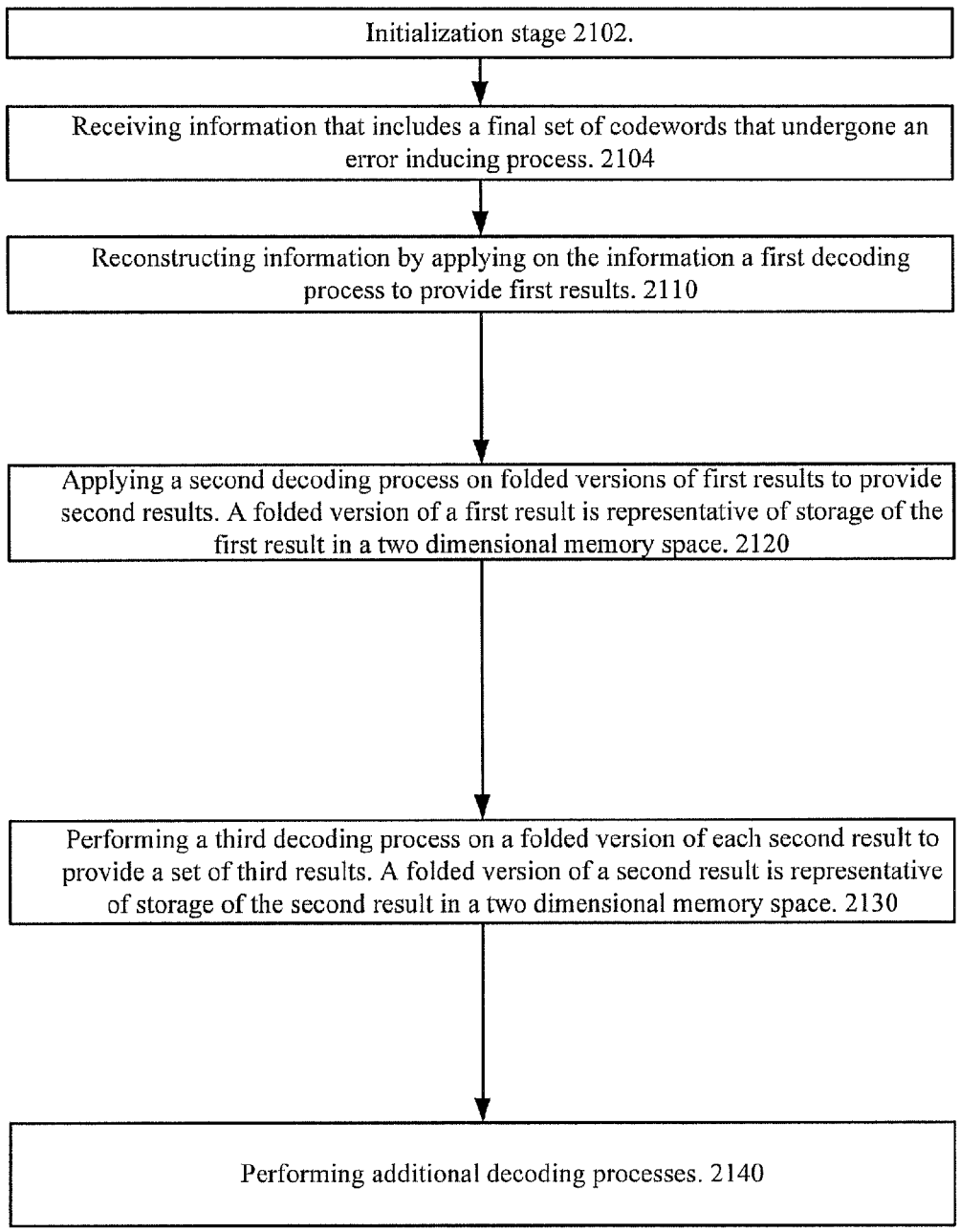
FIG. 1D illustrates an decoding method according to an embodiment of the invention.

FIG. 1D illustrates decoding method 2100 according to an embodiment of the invention.

Method 2100 may start by an initialization stage 2102. Stage 2102 may include configuring an error correction capability of at least one of the first and second decoding processes based on a desired error correction capability.

Stage 2102 is followed by stage 2104 of receiving information that includes a final set of codewords that undergone an error inducing process. The error inducing process is illustrated in FIG. 1A as the transmission of a message through channel 20 and the addition of noise e(x) to the message. The term final indicates that the information includes multiple sets of codewords wherein the final codeword is the outcome of the final decoding process. The information includes a message and an error. The final set of codewords is generated by method 2000. It can include, the two dimensional folded code of FIG. 2A, the three dimensional folded code of FIG. 6 or any p-dimensional folded code.

Stage 2104 is followed by stage 2110 of reconstructing information by applying on the information a first decoding process to provide first results. The results can be penultimate codewords and errors (if these errors were not corrected during the first decoding process).

Stage 2110 is followed by stage 2120 applying a second decoding process on folded versions of first results to provide second results. A folded version of a first result is representative of storage of the first result in a two or higher dimensional memory space. The second result can be the message itself of antepenultimate codewords and errors (if these errors were not corrected during the first and second decoding processes). If, for example, the received information included one or more errors and a two dimensional folded code (such as illustrated in FIG. 2A) then the outcome of the second decoding process may be the message itself (plus errors that were not corrected during the first and second decoding stages).

Stage 2110 may include storing each first result in multiple columns of a memory space and stage 2120 may include performing the second decoding process on rows of the memory space.

The first error decoding process may differ from the second decoding process. At least two first results have different lengths. At least two second results may have different lengths (can also have same length as a special case).

Stage 2120 may be followed by stage 2130 of performing a third decoding process on a folded version of each second result to provide a set of third results. A folded version of a second result is representative of a storage of the second result in a two or higher dimensional memory space.

The first, second and third error decoding processes may differ from each other. At least two results out of different sets of results may have different lengths. At least two results of the same set of results may have different lengths.

Method 2100 may include performing more than three decoding processes as illustrated by stage 2140 of performing additional decoding processes.

Method 2100 may include performing at least four decoding processes, wherein each decoding process except a first decoding process is applied on a folded version of a set of results obtained by applying a previous decoding process. All decoding processes may be applied on codewords that are not folded.

Method 2100 may include performing at least three decoding processes, wherein each decoding process except a first decoding process is applied on a possibly folded version of a set of results obtained by applying a previous decoding process, wherein at least one decoding process is applied only on redundancy bits generated by previous decoding processes. For example, a fourth decoding process can be applied on a parity field (that is denoted D4 in FIG. 6) that was generated by encoding redundancy bits (denoted D1, D2 and D3) generated by three other encoding processes.

Method 2100 may include performing at least three decoding processes, wherein each decoding process except a first decoding process is applied on a folded version of a set of results obtained by applying a previous decoding process, wherein at least two decoding processes differ from each other.

Figure 1E:
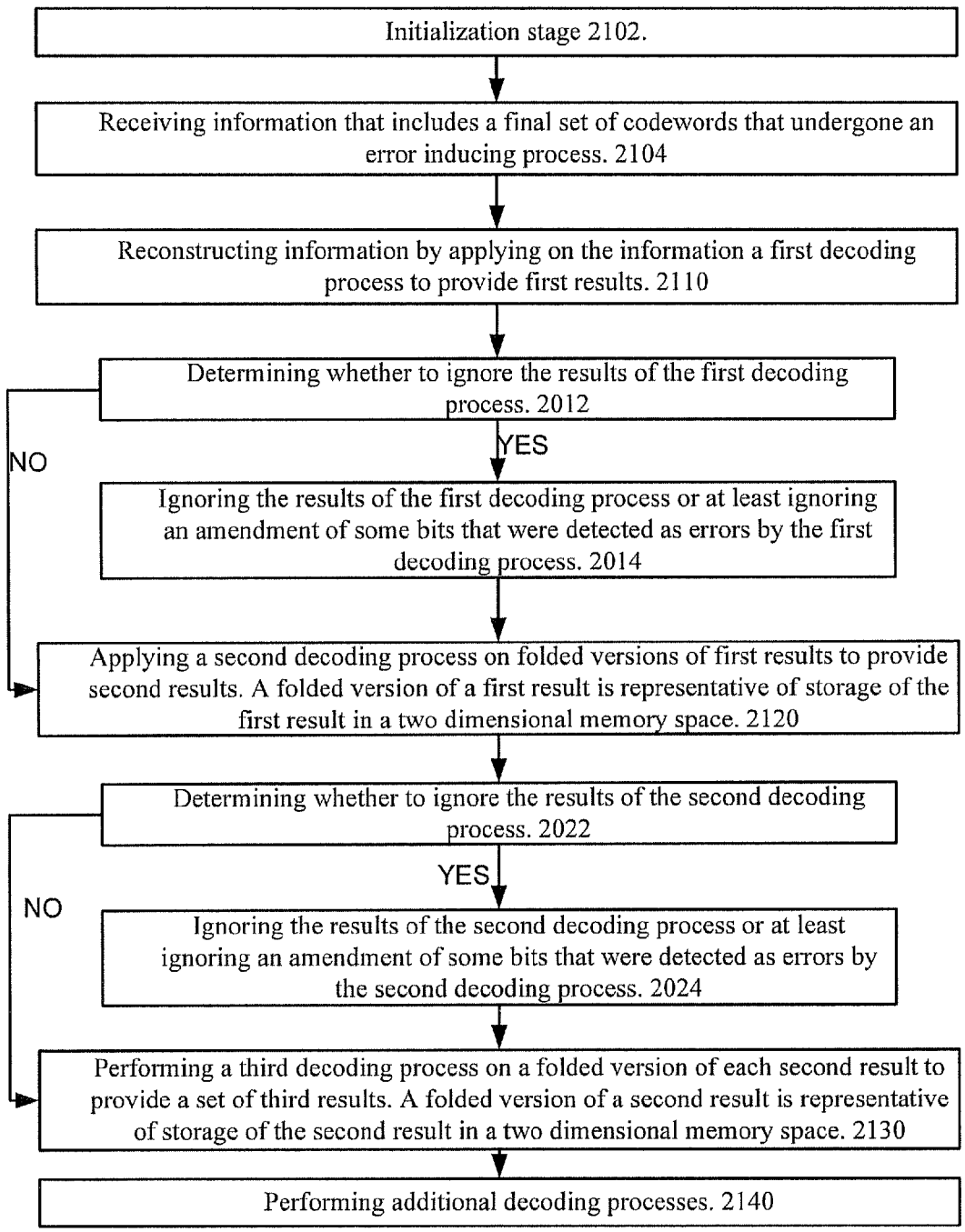
FIG. 1E illustrates an decoding method according to an embodiment of the invention.

FIG. 1E illustrates decoding method 2102 according to an embodiment of the invention.

Method 2102 differs from method 2100 by including stages 2012 and 2022. Equivalent stages may be applied in relation to additional (above three) decoding processes but for simplicity of explanation these stages are not shown.

Method 2102 includes performing at least two decoding processes, wherein at least one decoding process is followed by determining whether to ignore the results of the decoding process. The results of a decoding process can be ignored of if, for example, a miss-correction is detected or suspected. The ignoring can include applying a next decoding process on a folded version of each result of a decoding process that preceded the ignored decoding process. For example, assuming that the outcome of stage 2120 is suspected to include miss-correction (a correct bit was altered during stage 2120 to provide an erroneous bit) then stage 2130 may be applied on the outcome of stage 2110.

This determination (of whether to ignore) is illustrated by query stage 2012 that follows stage 2010 and by query stage 2022 that follows stage 2020. If stage 2012 determines to ignore then it is followed by stage 2014 of ignoring the results of the first decoding process or at least ignoring an amendment of some bits that were detected as errors by the first decoding process. Stage 2014 is followed by stage 2120. If stage 2022 determines to ignore then it is followed by stage 2024 of ignoring the results of the second decoding process or at least ignoring an amendment of some bits that were detected as errors by the second decoding process. Stage 2024 is followed by stage 2030.

Method 2102 may include ignoring the results of an ignored decoding process by providing to applying a next decoding process on a folded version of each result of a decoding process that preceded the ignored decoding process. Thus, stage 2024 may include providing to stage 2030 the results of stage 2010.

Method 2102 may include preventing a modification of at least one bit of a result by at least one decoding process if determining by at least one preceding decoding process that the at least one bit is correct. Thus, stage 2024 may involve providing to stage 2030 a modified outcome of stage 2020. The modified outcome does not include modification to one or more bits that were suggested or performed by stage 2020.

Each decoding process is characterized by correction threshold—the number of bits it can correct in a reliable manner. Method 2102 may include preventing a modification of information bits if a decoding process indicates that errors occurred in more information bits than the correction threshold of the decoding process.

Figure 7:
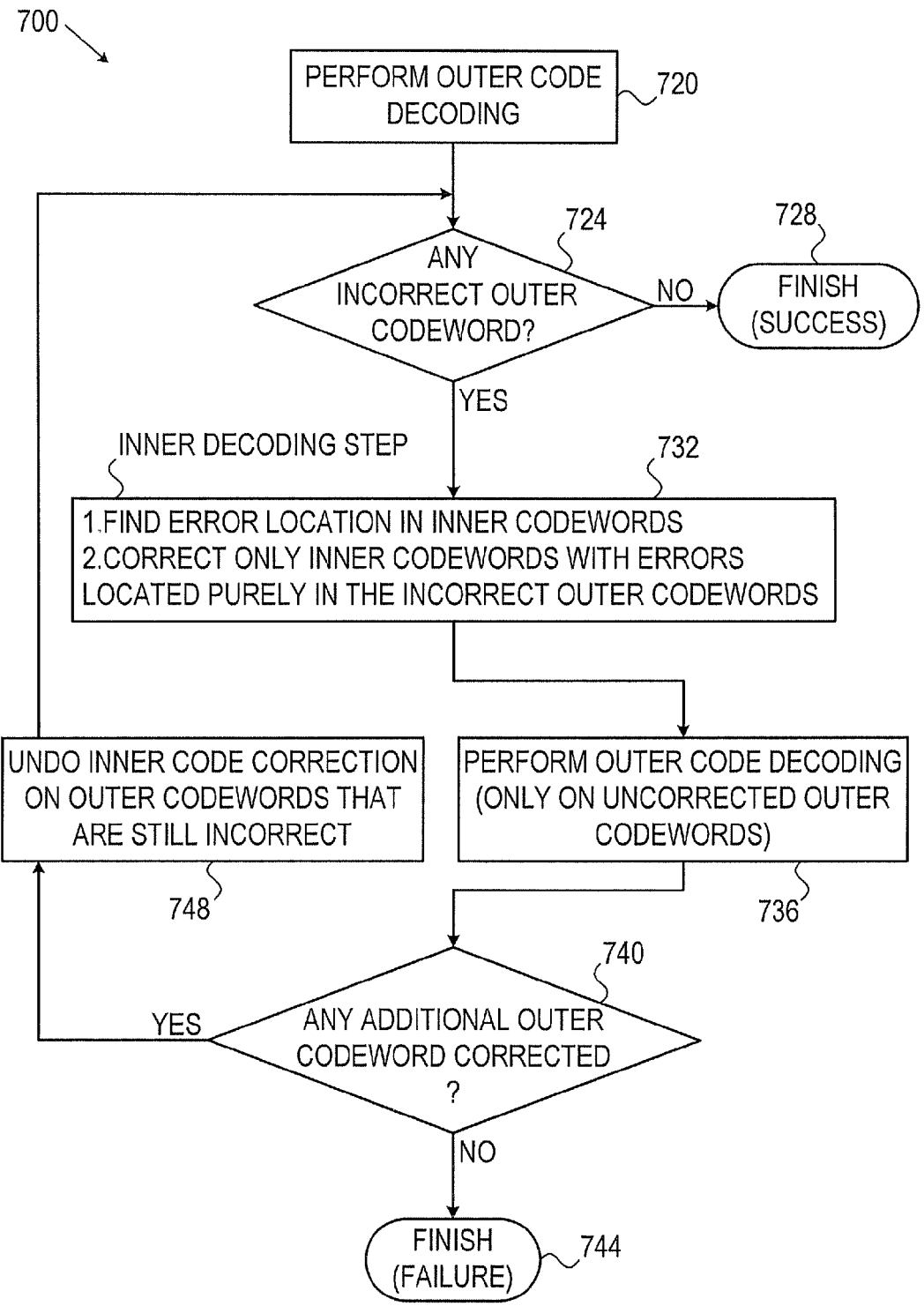
FIG. 7 illustrates an iterative decoding, according to an embodiment of the invention.

FIG. 7 provides a non-limiting example of an encoding process in which certain bits are not amended (due to possible miss-correction) by an outer code and are provided (without being amended) to the second decoding process.

Figure 1F:
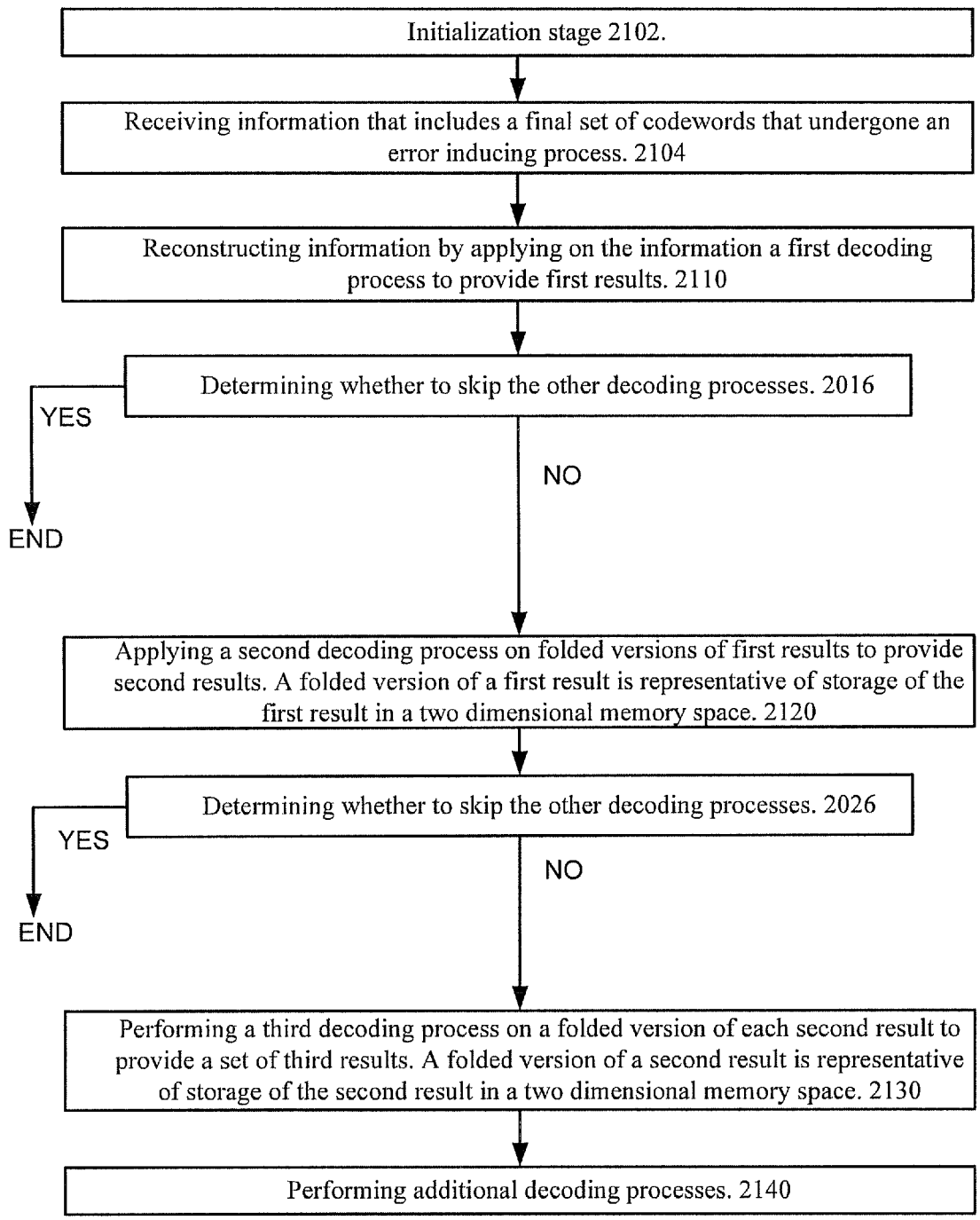
FIG. 1F illustrates an decoding method according to an embodiment of the invention.

FIG. 1F illustrates decoding method 2104 according to an embodiment of the invention.

Method 2104 differs from method 2100 by stages 2016 and 2026. Equivalent stages may be applied in relation to additional (above three) decoding processes but for simplicity of explanation these stages are not shown.

Method 2106 includes performing at least two decoding processes. At least one decoding process is followed by determining whether to skip at least one decoding process that follows the decoding process. If, for example, the outcome of a first decoding process (stage 2110) is more reliable than a predefined reliability threshold then method 2100 may skip stage 2120. The determining to skip at least one decoding process can be made if at least one decoding process that preceded the determination provided a result of a desired characteristic. This determination is illustrated by query stage 2016 located between stages 2110 and 2120 and by query stage 2026 located between stages 2020 and 2030. It is noted that the skipping may include skipping all remaining decoding stages or skipping only a portion of the remaining decoding processes.

According to an embodiment of the invention stage 2020 may benefit from the outcome of stage 2010. The same applied to each decoding process that follows one or more other decoding processes. For example, stage 2020 may include performing an error location search of a decoding process in response to error locations that were found during a previous decoding process—during stage 2010.

Figure 1G:
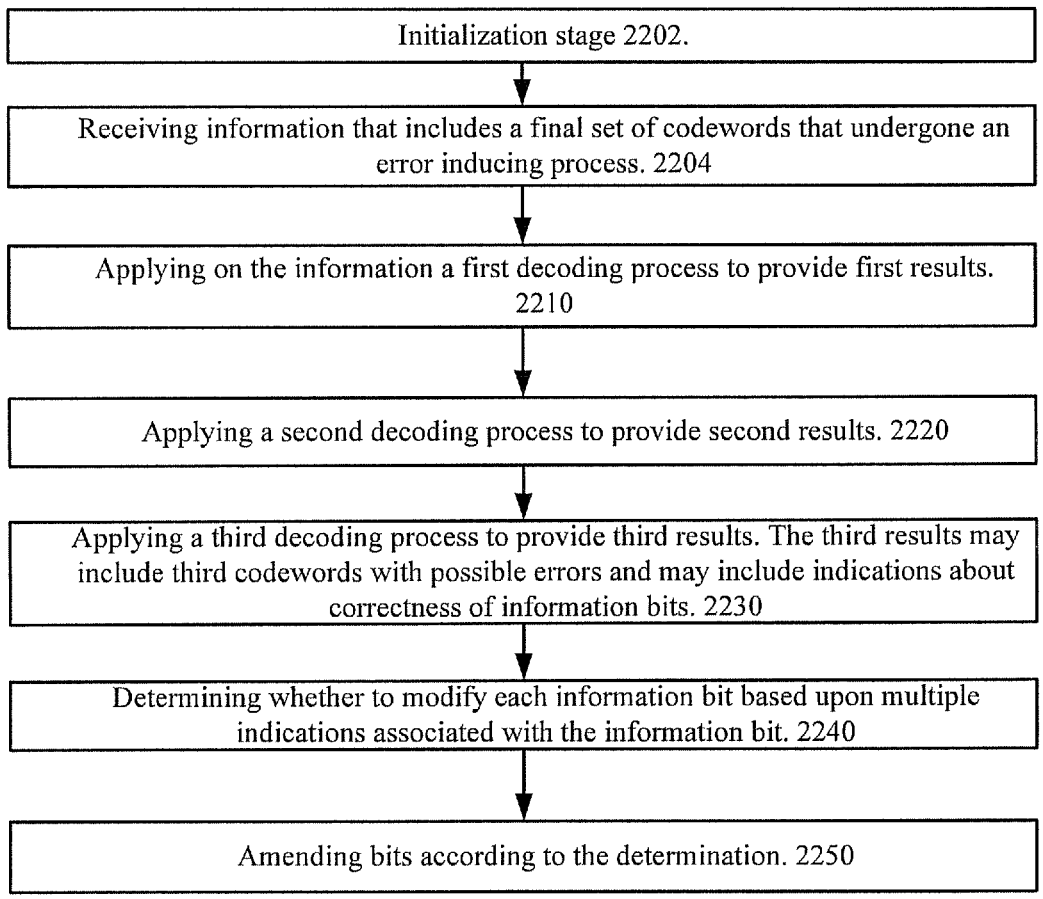
FIG. 1G illustrates an decoding method according to an embodiment of the invention.

FIG. 1G illustrates decoding method 2200 according to an embodiment of the invention.

Method 2200 may start by an initialization stage 2202.

Stage 2202 is followed by stage 2204 of receiving information that includes a final set of codewords that undergone an error inducing process.

Stage 2204 is followed by stage 2210 of applying on the information a first decoding process to provide first results. The first results may include second codewords with possible errors and may include indications about correctness of information bits.

Stage 2210 is followed by stage 2220 of applying a second decoding process to provide second results. The second results may include second codewords with possible errors and may include indications about correctness of information bits.

Stage 2220 may include applying a second decoding process on the information, on first codewords with errors or on modified first codewords with errors. Modified first codewords are first codewords that may include at least one unmodified bit that was indicated by the first decoding process as an erroneous bit but was not amended. The bit is unmodified if there is a chance that its modification may result in a miss-correction.

Stage 2220 is followed by stage 2230 of applying a third decoding process to provide third results. The third results may include third codewords with possible errors and may include indications about correctness of information bits.

Stage 2230 may include applying a third decoding process on the information, on second codewords with errors or on modified second codewords with errors. Modified second codewords are second codewords that may include at least one unmodified bit that was indicated by the second decoding process as an erroneous bit but was not amended. The bit is unmodified if there is a chance that its modification may result in a miss-correction.

Stage 2230 may be followed by stage 2240 of determining whether to modify each information bit based upon multiple indications associated with the information bit.

Stage 2240 may include determining whether to modify each information bit based upon a majority of indications associated with the information bit.

Stage 2240 may include determining to modify each information bit if at least a predetermined number of indications associated with the information bit indicate that the bit should be modified.

Stage 2240 may be responsive to confidence levels of different indications associated with the information bit. A decoding process that has a stronger error correction capability may provide indications that are more confident. If a decoding process can detect up to X errors in a reliable manner then if it detects more errors (X+y) then the confidence level associated with its error detections may be lower. In soft decoding, every correction of X+y bits has a corresponding confidence level, since there is a reliability measure per bit.

Thus the correction hypothesis is chosen to be the most likely one; and the decision whether to implement the correction or not depends on the reliability measure of the most likely hypothesis.

Stage 2240 is followed by stage 2250 of amending bits according to the determination.

Method 2200 may include additional (more than three) decoding processes and determining whether to modify bits based also upon these additional decoding processes but for simplicity of explanation these stages are not shown.

Figure 13:
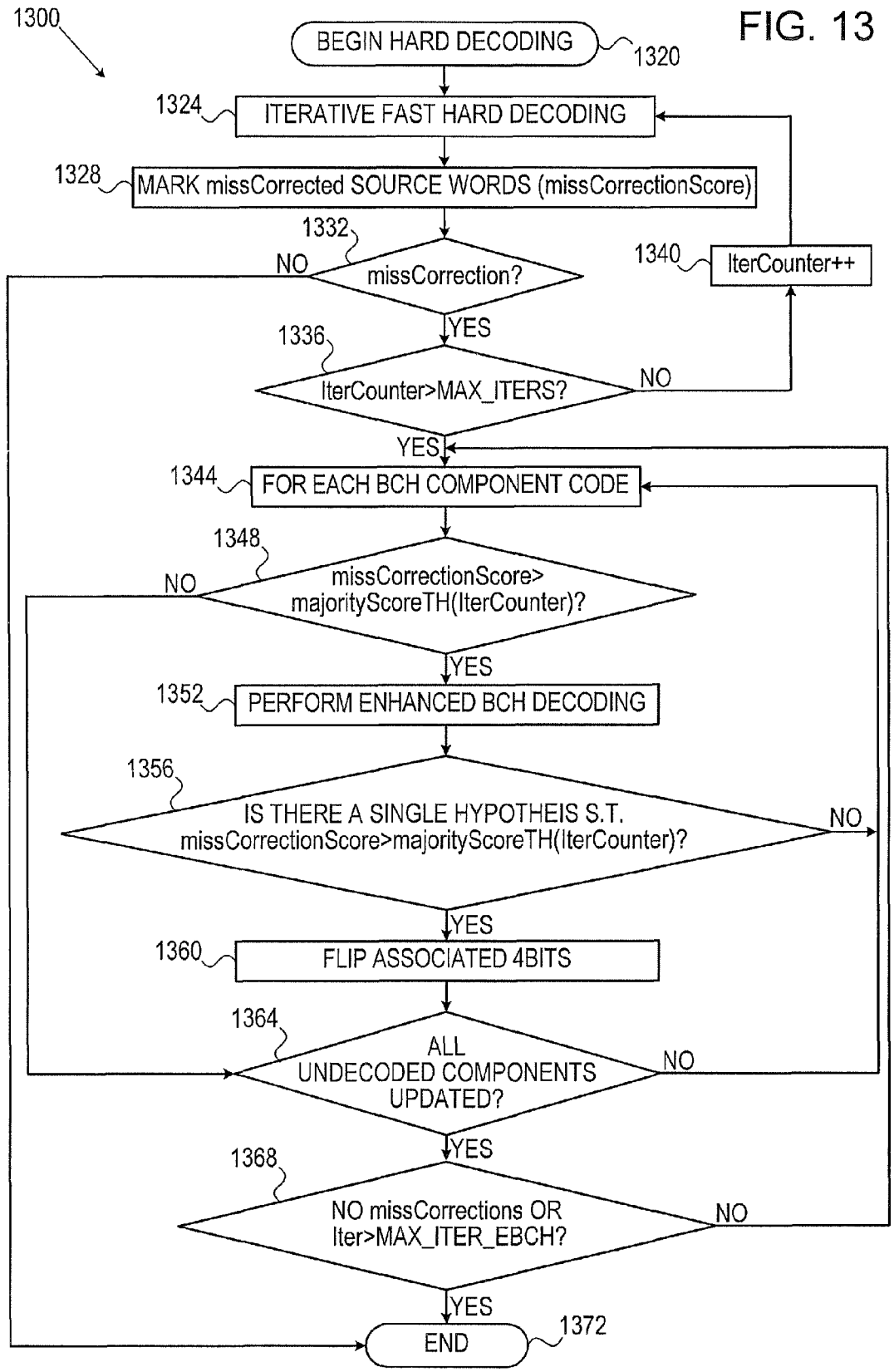
FIG. 13 illustrates an iterative decoding with enhanced BCH algorithm, according to an embodiment of the invention.
Figure 14:
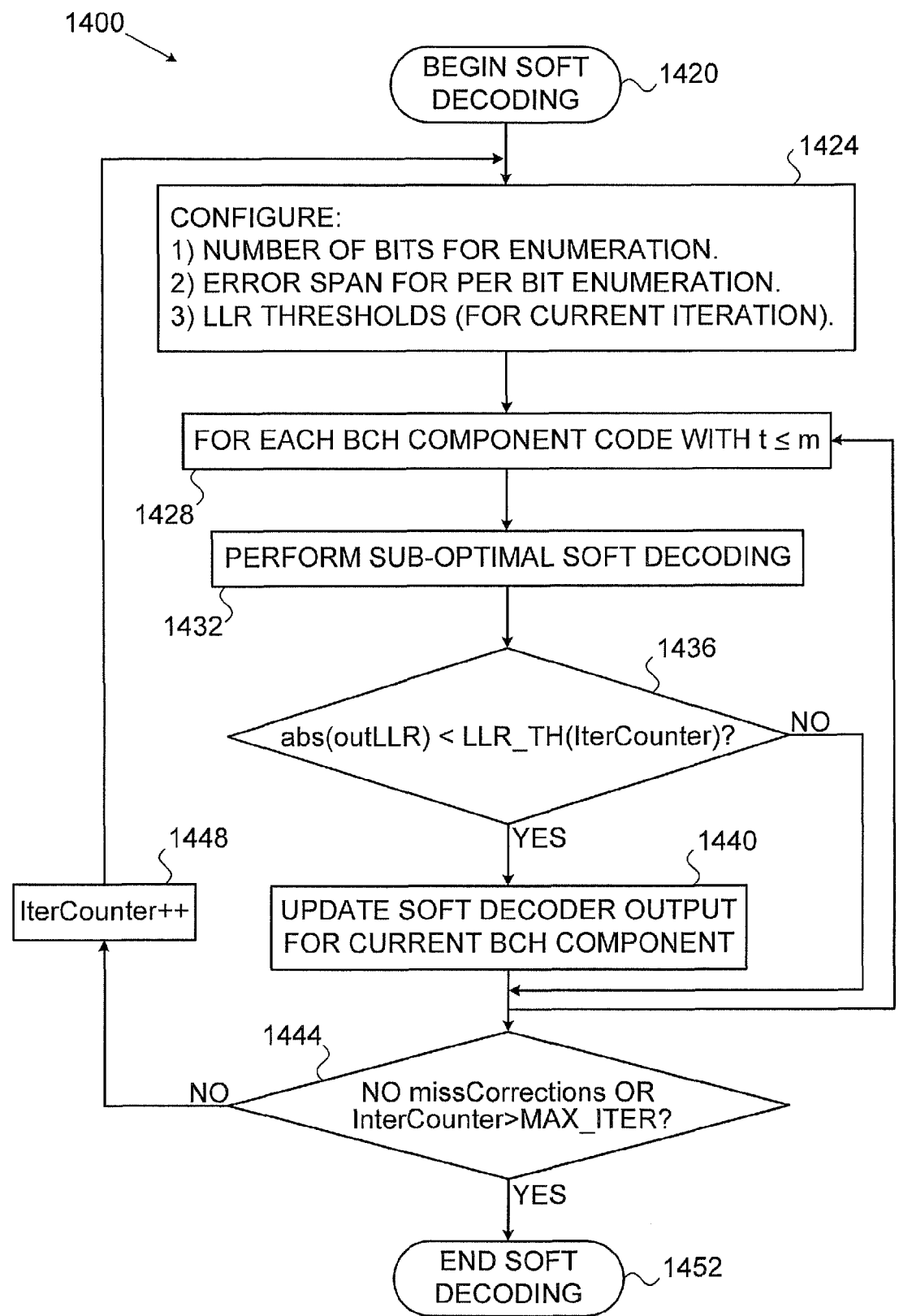
FIG. 14 illustrates an iterative soft decoding flow, according to an embodiment of the invention.

FIGS. 13 and 14 illustrate methods in which bit may be modified based upon indications (such as correctness indications) associated with different information bits. These Figures describe a basic flow of hard decoding and soft decoding, respectively.

Figure 1H:
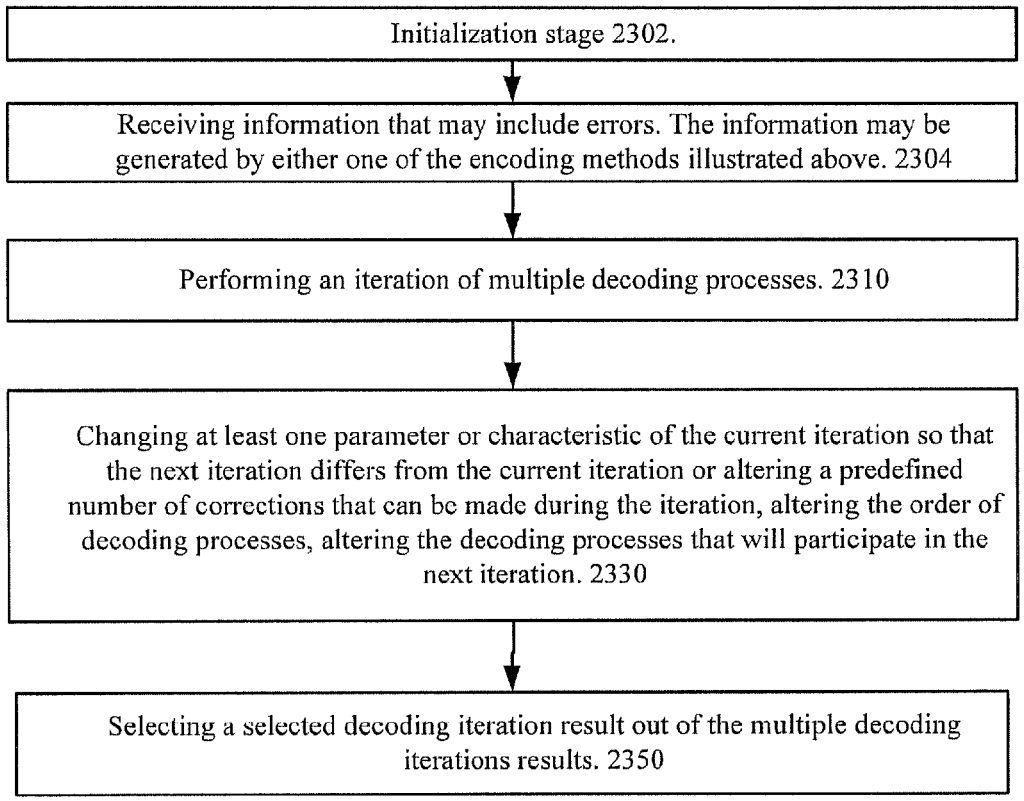
FIG. 1H illustrates an decoding method according to an embodiment of the invention.

FIG. 1H illustrates decoding method 2300 according to an embodiment of the invention.

Method 2300 may start by initialization stage 2302.

Stage 2302 may be followed by stage 2304 of receiving information that may include errors. The information may be generated by either one of the encoding methods illustrated above.

Stage 2304 may be followed by stage 2310 of performing an iteration of multiple decoding processes.

Stage 2310 may include executing multiple decoding stages and optionally additional stages of either one of methods 2100, 2102, 2104 and 2200.

Stage 2310 may include performing multiple instances of a single decoding process.

Stage 2310 may be followed by stage 2320 of determining whether to perform another iteration of multiple decoding processes. If the answer is positive then stage 2320 is followed by either one of stages 2310 and 2330.

Stage 2310 may include determining to perform a second iteration of multiple decoding processes if the first iteration result does not satisfy a predefined criteria such as a reliability criteria.

Stage 2310 may include determining to perform a second iteration of multiple decoding processes if the first iteration failed.

Stage 2330 may include changing at least one parameter or characteristic of the current iteration so that the next iteration differs from the current iteration.

Stage 2330 may include altering a predefined number of corrections that can be made during the iteration, altering the order of decoding processes, altering the decoding processes that will participate in the next iteration, and the like.

For example, stage 2310 may include performing an iteration of multiple decoding processes while allowing a correction of up to a predefined number of corrections. Stage 2330 may include altering the predefined number of corrections. Stage 2330 will be followed by stage 2310 that will include allowing a correction of up to an altered predefined amount of corrections. The number of allowed corrections can increase as the number of iteration increases but this is not necessarily so.

Stage 2310 may include storing the results of the decoding process iteration. Stage 2310 may be followed by stage 2350 of selecting a selected decoding iteration result out of the multiple decoding iterations results. Thus, a decoding iteration that is most reliable can be selected and its output may be selected as the message.

The multi dimensional folded code may have p dimensions, wherein p is a positive integer. Each dimension may correspond a different ordering of the input data, and coded with BCH codes—each dimension is generated by applying a BCH code on data or on codewords of a previous dimension.

The data to the codes may be folded over several columns or rows in order to obtain higher rate codes.

FIG. 2A illustrates a two dimensional folded code. In the example, a stream of data (also referred to as data) is divided into four parts, each part is encoded (using a BCH code) and a redundancy is appended to the end of that part. Each of these codewords (also referred as first codewords) are then folded into three columns which constitute (what we call) an outer code.

Matrix 100 of FIG. 2A includes thirteen columns 110(1)-110(13) and sixteen rows 120(1)-129(16). It stores four first codewords such as first codeword 130(1). Each first codeword includes thirty three data bits and three redundancy bits. First codeword 130(1) includes data bits 131(1) and redundancy bits 132(1). First codeword 130(2) includes data bits 131(2) and redundancy bits 132(2). First codeword 130(3) includes data bits 131(3) and redundancy bits 132(3). First codeword 130(4) includes data bits 131(4) and redundancy bits 132(4).

Each first codeword is stored in a folded manner in matrix 100. In other words matrix 100—stores folded version of each first codeword.

A second encoding process is appended on the first twelve bits of each two adjacent rows of matrix 100 to provide second codewords. The redundancy bits are stored in the thirteenth column 100(13) of matrix 100.

By grouping together the columns of the resultant outer code a matrix is provided which is then divided into rows. Each one or more rows then constitute the data for another BCH encoding process to provide inner codewords. The redundancies of the inner code are grouped together and appended to the sequence of outer codewords.

It is noted that the inner codes and the outer codes may differ in that the redundancy of the outer code is also encoded by the inner code while the inner code's redundancy is not further encoded. Yet a further code may be appended to protect the redundancies of the inner codes.

The rate of the codes may be configured in several ways. For example, the length of the data/redundancy can differ from one code to another. The number of rows/columns for each code may be modified. Zero padding may be added to the matrix in order to complete the outer codes to full columns.

The following numerical example illustrates two codes that are referred to as outer code and inner code.

The outer Code is characterized by the following characteristics: BCH code over $GF(2^{15})$, data length: 2048 bytes, correction capability 32 errors, redundancy 60 bytes, codeword length 2108 bytes, folding—the codeword is folded into 17 columns of 124 bytes, number of outer code-words 4.

The inner code is characterized by the following: BCH code over $GF(2^{10})$, data length of 68 bytes, correction capability 1 error, redundancy 10 bits, codeword length 690 bits, folding—codeword uses full bytes from each column (no folding), number of inner code-words 124. The redundancy of the inner code is 1240 bits—155 bytes which are appended to the sequence of outer codes.

The rate of the code is determined by the redundancy added by each of the outer codes and the overall redundancy added by the inner codes. As will be shown, it is possible to construct the component codes in such a manner that the code rate and composition will be parametric and highly configurable.

FIG. 2B illustrates encoding unit 200 according to an embodiment of the invention. Encoding unit 200 is able to perform on the fly encoding, and does not require extensive buffers. It may operate without any buffer or with a small amount of buffering). This is since the code is systematic, and only the generated parity bits are to be stored.

The term encoding unit has the same meaning as the term encoder. It is used for simplicity of explanation and for differentiating between encoders 210 and 220 and encoding unit 200.

Encoding unit 200 is illustrated in FIG. 2B as including a first encoder (referred to as outer encoder) 210 and second encoder (referred to as inner encoder) 220. Outer encoder 210 is connected to an output port 204 of encoding unit and to switch 212. Both input and output encoders 210 and 220 are connected to switch 214. Switch 214 selects to output data, redundancy bits generated by encoder 200 and just then to output redundancy bits generated by inner encoder 220.

It is assumed that inner encoder 220 managed V-bits (for example 8 or 16 bits) at a time. Data is received at input port 202 and passes through outer encoder 210. Outer encoder 210 appends a redundancy to the data bits following every section of data bytes corresponding to the data length of the outer code (e.g. this would be 2048 bytes according to the numeric example discussed above). BCH encoding may be done by using a linear feedback shift register through which the data (so called systematic data) is passed. Therefore, the data simply passes through the outer encoder 210 without being modified while the linear feedback shift-register of outer encoder 210 advances. When the systematic data of the code completely passed through the linear feedback shift-register, the content of the linear feedback shift register is the redundancy of the code and is appended to the data stream. A similar principle works also for the inner encoder 220.

Inner encoder 220 includes state memory 250, counter 240 and V-step shift register logic 230. The inner encoder 220 works on the stream outputted by the outer encoder 210. The stream is parsed into V-bit sections and the inner encoder works on V bits at a time. Each section of V-bits is associated with a different inner code and is used to advance the state of the relevant inner code. Each state is stored in register out of registers 260(1)-260(N2) of V-step shift register logic 230 of inner encoder 220. Then, the state is stored in memory and the state of the next inner encoder is obtained from the state-memory 250 and is advanced according to the next set of V-bits. The counter determines the address of the inner code state to be used. When the entire stream of data and redundancy due to the outer code has passed, switches SW1 212 and SW2 214 change their stage to state B (up to this moment they were in state A) and the redundancy of the inner codes is flushed out sequentially from the state memory.

It is noted that the number of inner codes (and hence the number of rows in the code matrix) may be determined by the size of the state memory (or by the number of addresses iterated by the counter). Furthermore, the overall length of the data outputted from the outer encoder need not divide the number of inner codes as few of the inner codes may work on less data than the others (this is equivalent to zero padding some of the element in the matrix in FIG. 2A).

The outer code can be made configurable in several ways. The code length can be modified quite easily. By choosing to pass through a linear feedback shift register (of the BCH encoder) less or more of the information contents of the codeword can be encoded. By appending the contents of the linear feedback shift register to the information bits a legitimate BCH code word is provided. Thus, generalizing the length of the code may become an easy task. The operation of the decoder is hardly modified as the resultant codeword is a legitimate one. The decoder needs only to calculate the syndrome and perform the Chien-search on the bits generated by the codeword.

FIG. 4 shows an example of a linear feedback (also referred to as BCH encoder) shift-register 300 according to an embodiment of the invention. It includes fifteen taps—fifteen storage element 306(1)-306(15). Storage elements 306(2)-306(15) are connected to each other in a sequential manner. The output of storage element 306(15) is the output node of linear feedback shift register 300 and is also connected to adders (XOR operation) 302 and 304. Adder 302 adds an input data bit (from input port 314) to an output signal of storage element 306(15) and provides the sum to storage element 306(1). Adder 304 adds an output signal of storage element 306(15) to an output signal of storage element 306(1) and provides the sum to storage element 306(2).

Linear feedback shift-register 300 allows to correct a single codeword for a code designed under the Galois field $GF(2^{15})$. It is noted that after the last information bit passes through storage element 306(15) then storage element 306(15) stores the single redundancy bit.

FIG. 4 shows an example of a configurable linear feedback (also referred to as BCH encoder) shift-register 400 according to an embodiment of the invention. It includes r taps—r storage elements 420(1)-420(r), r adders 440(1)-440(r) and r configurable circuits. Each configurable circuit includes a configuration storage element and a logic gate. Configuration storage elements 410(1)-410(r) store configuration information indicative of whether to provide feedback to each tap or not. Logic gates 450(1)-450(r) perform a logic operation on the output signal of storage element 450(r) and the configuration information and provides the outcome to adders 430(1)-430(r), each adder is connected between two storage elements.

Linear feedback shift register 400 may allow a correction of more errors in comparison to linear feedback shift register 300. The maximum redundancy is denoted r. The number of errors that could be corrected will typically be r/m or more where m determines the Galois field $GF(2^m)$ over which the code operates. In FIG. 4 $m$ may equal 15. The taps can be configured by setting the configuration storage elements 410(1)-410($m*t$) where t is the correction capability.

Codes with smaller redundancy (and lower correction capability) may be accommodated by setting the first c configuration storage elements to 0 and setting the rest of the configuration storage elements registers (DFc+1, ... DFr) to the appropriate tap values.

The encoding may then proceed while the redundancy of the code will be present at the (c+1)'th storage element through the r'th storage element after that last data bit passed through register Dr. It is noted that the encoding process can be modified to advance v steps at a time with appropriate modifications to the logic function circuitry at the input of the data FFs. It is noted that that the number of registers 260(1)-260(N2) will still remain the same also for the V-step advance case.

The inner encoder 220 may be configured in the same way that the outer encoder 210 has been configured but can also be configured by modifying the number of states the counter will count over. This will essentially determine the number of rows in the code matrix.

Figure 5:
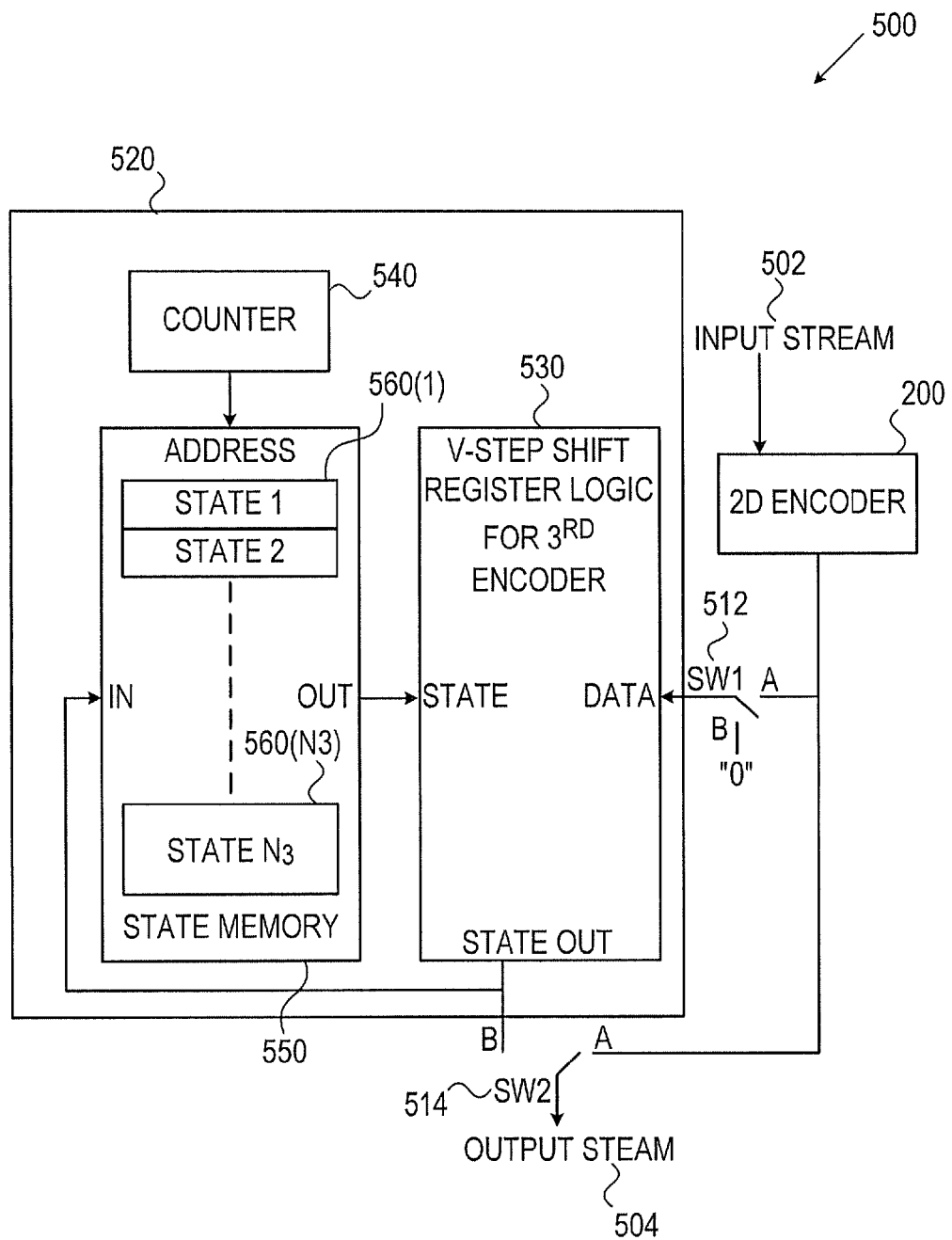
FIG. 5 illustrates a 3D encoder, according to an embodiment of the invention.

A 3D encoding unit can be constructed on the basis of a two dimensional encoder such as encoding unit 200 of FIG. 2B. An example is shown in FIG. 5. The structure of encoding unit 500 is now very similar to that of encoding unit 200 except that outer encoder 210 is replaced with encoding unit 200 and a $3^{rd}$ BCH encoder (520) operates on the output of encoding unit 200. As before, the $3^{rd}$ encoder's state is rotated, round robin like. Thus, the output of the encoding unit 200 can be thought of as a plane. Several such planes exist and the $3^{rd}$ encoder 520 may operate on several points from each plane. Folding of the third code refers to multiple lines/planes which are used for every codeword of the $3^{rd}$ encoding process.

It is well known that turbo product codes (TPC) achieve high performance for low and moderate code rates.

This invention discloses a method for obtaining high performance for high rate codes through folding of code components, as demonstrated for the 2D and 3D codes. Another example for multi-dimensional encoding is by encoding information bits separately in every dimension. The encoding scheme described in FIG. 5 is an "on the fly" encoder. The output of the 2D encoder is a streaming output which is essentially a shifted version of the streaming input. The only difference with respect to the input is that a redundancy is added. The logic for the $3^{rd}$ decoder operates on the streaming output of the 2D encoder as it passes. Therefore, we obtain an encoding operation for all dimensions (possibly with small latencies).

In the encoding scheme presented in FIG. 6 a different efficient multi-dimensional parallel encoding is carried out. Every BCH component code operates on single or multiple planes (folding) and generates parity (redundancy) bits. This allows having multiple component codes operate in parallel for the encoding, provided that the information bits are available. The last encoding step includes protection of the parity bits by using another component code for the parity bits. This results in Parity D4 vector in FIG. 6. It is noted here that such additional encoding component for parity bits may be used also in the scheme of FIG. 5, and FIG. 2B where a single BCH component code can be used for all parity bits obtained from the encoding of the last stage. FIG. 6 illustrates a three-dimensional data structure, that includes a first set of parity bits (D1) 610 generated by applying a first encoding process, a second set of parity bits (D2) 620 generated by applying a second encoding process and a third set of parity bits (D3) 630 generated by applying a third encoding process. The second encoding process is applied on a folded version of first codewords (generated by the first encoding process). The third encoding process is applied on a folded version of second codewords (generated by the second encoding process). A fourth encoding process is applied only on the parity bits (D1, D2, D3) and provides redundancy bits D4.

Per dimension different component codes may used. This may allow variation in the folding ratio and in component code redundancy within every dimension. It is well known that irregular turbo product codes may achieve improved performance over conventional TPC, where in each dimension the same component code is used for all encoded lines.

By using different component codes a high coding diversity can be obtained over every dimension. As an example of simple irregular multi-dimensional encoding of folded BCH components, every component code may have same length (determined by number of planes per component code), and encode with variable redundancy size, thus some components will have higher error correction capabilities than other components of a certain dimension. The overall performance gain is provided from the iterative decoding process.

It is noted that for any carefully designed code the decoding can be done in several steps where success can be obtained already in the early steps. Thus the decoding delay may be small, e.g. in cases that only few errors occur.

In some cases only few of the decoding processes are applied and some other decoding processes are skipped. For example—only outer decoding can be applied (while skipping an inner decoding process)—especially where the outer code is stronger—capable of amending more errors. The outer code refers to the code component used for the $1^{st}$ dimension of the multi-dimensional. The codes need not be symmetric and it may be the case that the outer code corrects a great many errors. In that case, it may be possible to read out the codeword and correct it only using the outer code decoder.

A decoding success (miss-correction) per outer codeword may be determined in several ways. For example—the data of each outer-codeword may contain a CRC which may be checked. Miss-correction in BCH code may also be determined during the Chien-search phase of the decoder. Primarily, if a smaller number of zeros is found than the degree of the ELP, a miss-correction is declared and no bit is corrected. Such miss-correction detection can be extremely reliable when the error correction capability is large enough and when the codeword length is smaller than the field size.

It should be noted that each codeword may include several outer codewords and it may be that some of the outer codewords are decoded correctly and for some, miss-correction has been detected and no correction is performed.

When applying multiple decoding processes the decoding can start by performing an outer decoding process alone. This can reduce the latency as only a part of the data matrix should be received before starting the decoding.

If an outer decoding process failed, an inner ($2^{nd}$ dimension) decoding process can be initiated.

All the inner codewords are decoded and corrected. When there is a high reliability miss-correction indication for outer codewords—only bits that belong only to outer codewords that were not successfully decoded during the previous phase (Outer only) are corrected. In fact, if a decoder of an inner codeword suggests to correct a bit that belongs to an outer codeword which is known to be correct, a miss-correction may be declared and non of the corrections suggested by that inner decoder are performed. This can be followed by applying the outer decoding process to correct any "left-over" errors.

Correction Without Re-Calculating the Entire Syndrome

During the decoding procedure of the BCH code it is typical to calculate a syndrome. The syndrome of the outer codeword (or the inner codeword in the following iterations) may be calculated by going over the entire information. However, this may not be necessary as the method may involve adding to the existing outer syndromes the effect of the corrections made by the inner codes. This may save a considerable time. This may be very noticeable when the decoding processes have a small correction capability (for example—1, 2 or 3 errors) as in these cases there exist methods of finding the errors positions directly from the syndrome, without performing a BM and a Chien-Search step.

Multiple iterations of multiple decoding processes can be applied during iterative decoding. An iteration can include, for example, an outer decoding process and an inner decoding process. The iterations can be stopped once a predefined iteration limit is reached, or when further iterations will not amend additional errors. Before a next iteration is executed outer codes that were not successfully decoded during a previous iteration may be amended by reversing the effect of the previous iteration or at least reversing the affect of an inner corrections done by the inner code (in the previous phase) on those outer codes that were not successfully decoded in the previous step. FIG. 7 shows the flow of the iterative decoding which incorporates all decoding phases.

FIG. 7 and Table 1 illustrate method 700 for soft/hard decoding according to an embodiment of the invention.

TABLE 1

| # | Stage | Next stage | Next stage if yes | Next stage if not |
|---|---|---|---|---|
| 720 | Perform outer code decoding | 724 | | |
| 724 | Check if there are any incorrect outer codewords | | 732 | 728 |
| 732 | Find error locations in inner codewords. Correct only inner codewords with errors located purely in the incorrect outer codewords | 736 | | |
| 728 | Finish (iterative decoding succeeded) | | | |
| 736 | Performing outer code decoding on uncorrected outer codewords | 740 | | |
| 740 | Check if there are additional outer codewords that were corrected | | 748 | 744 |
| 744 | Finish (iterative decoding failed) | | | |
| 748 | Undo inner code correction on outer codewords that are still incorrect | 724 | | |

Soft decoding may also be included in the iterative decoding process. Soft decoding of BCH codes is possible using sub-optimal decoding methods for BCH component codes with low hard decoding correction capabilities (for example—1, 2, or 3 errors). Soft decoding need not be applied for all decoding stages. For example, it may be used only during the inner codeword decoding process. In that case, an inner decoding process step can include a soft decoding step of a hard decoding step.

Decoding one Error Beyond the BCH Bound

Typically, a BCH decoder is only capable of correcting up to $t=(D-1)/2$ errors where D is the code minimum distance.

However, there are methods of decoding more than this limit or at least suggesting several possible candidates. The following illustrates a method of correcting t+1 errors (or suggesting several possible candidates) with a relatively low complexity.

A decoding process (or a decoder that implements such a decoding process) performs syndrome calculation, error location polynomial (ELP) calculation, and Chien search. The ELP is used during the Chien search step to identify error locations as these locations can be associated with $x=\alpha^{-i}$ which nullify the ELP. The ELP calculation step illustrated below facilitates a recovery of an ELP of degree t+1 instead of just degree t.

Figure 8:
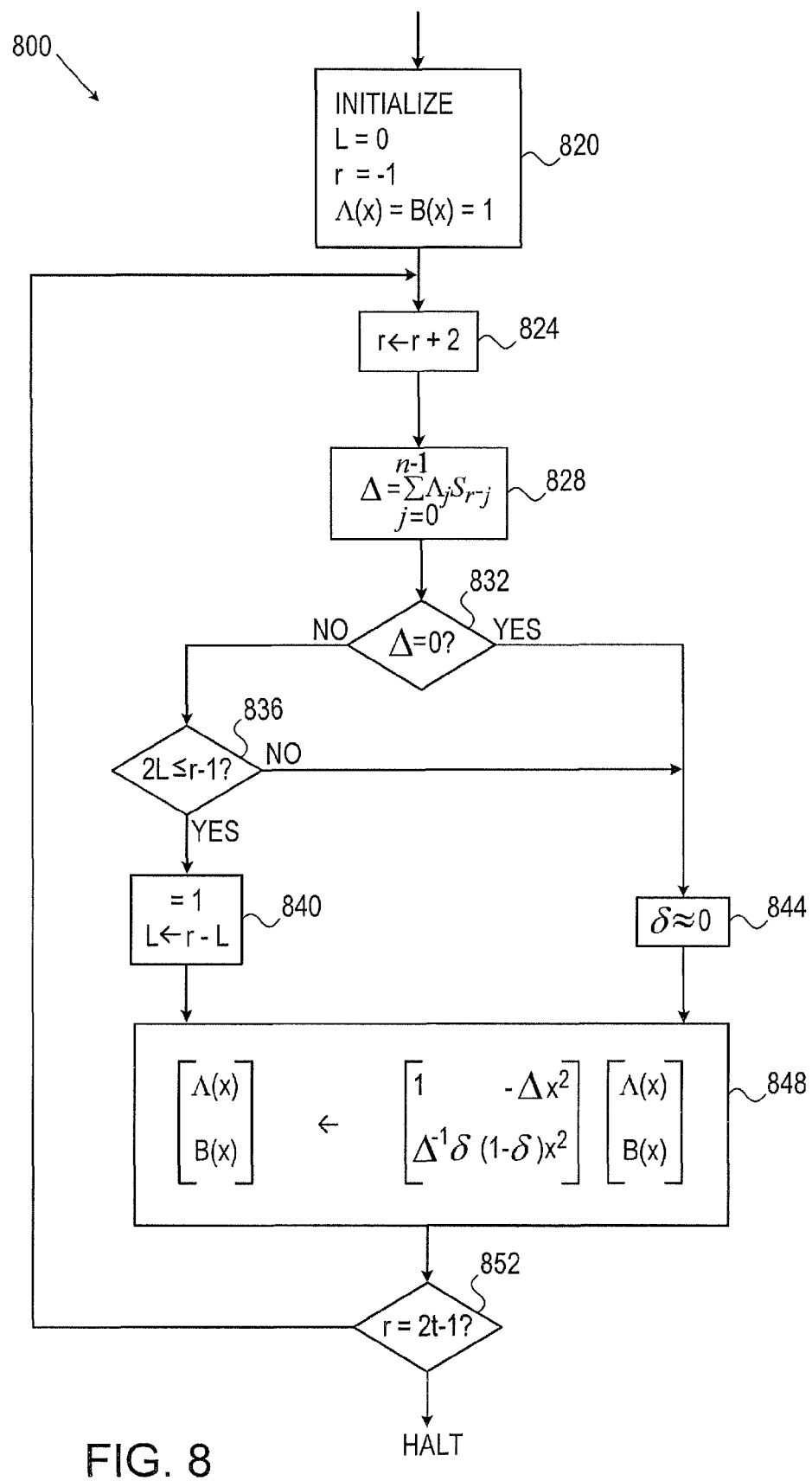
FIG. 8 illustrates a Berlekamp Massey algorithm for computing the error locating polynomial (ELP) for binary BCH codes, according to an embodiment of the invention.

FIG. 8 and Table 2 illustrate the Berlekamp Massey (BM) algorithm for recovering the ELP from the syndrome. This algorithm relies on the fact that in at error correction BCH code we are assured that the first 2t elements ($S1, \ldots, S2t$) of the syndrome are 0. If this is not the case, then an error occurred. As the values of the syndrome elements $2t+1, 2t+3, 2t+5, \ldots$, are not known in advance the BM algorithm will not be able to recover more than a degree t ELP. That is, the BM iterates t times and at the end of the last iteration $\Lambda(X)$ contains a degree t polynomial, pointing to all error locations.

TABLE 2

| # | Stage | Next stage | Next stage if yes | Next stage if not |
|---|---|---|---|---|
| 820 | Initialize L = 0; r = −1; $\Lambda(x) = B(x) = 1$ | 824 | | |
| 824 | r = r + 2 | 828 | | |
| 828 | $\Delta = \sum_{j=0}^{n-1} \Lambda_j S_{r-j}$ | 832 | | |

TABLE 2-continued

| # | Stage | Next stage | Next stage if yes | Next stage if not |
|---|---|---|---|---|
| 832 | $\Delta = 0$? | | 844 | 836 |
| 844 | $\delta = 0$ | 848 | | |
| 836 | $2L \leq r - 1$ ? | | 840 | 844 |
| 840 | $\delta = 0, L = r - L$ | 848 | | |
| 848 | $\begin{bmatrix} \Lambda(x) \\ B(x) \end{bmatrix} = \begin{bmatrix} 1 & -\Delta x^2 \\ \Delta^{-1}\delta & (1-\delta)x^2 \end{bmatrix} \begin{bmatrix} \Lambda(x) \\ B(x) \end{bmatrix}$ | 852 | | |
| 853 | r = 2t − 1 ? | | END | 824 |

On the other hand, if the value of element $2t+1$ of the syndrome was known, just following encoding (bearing in mind that elements $2t+2$ and $2t$ are 0), this element can be subtracted from the syndrome obtained after reading an erroneous codeword and continue the BM an additional iteration to recover an ELP of degree t+1 for locating t+1 errors.

However, during the time of decoding the post encoding value of element $2t+1$ of the syndrome is not known. Therefore, the decoding process can enumerate over it. As $\Lambda_0=1$, this is equivalent to enumerating over all possible values of $\Delta$ (during the last iteration). Thus, many candidates ($2^m-1$) for the degree t+1 ELP are obtained and are defined by $\Lambda(x)=V_1(x)-\Delta \cdot V_2(x)$, where $V_1(x)=\Lambda^{(2t-1)}(x)$, $V_2(x)=B^{(2t-1)}(x) \cdot x^2$, and $\Delta$ may be any element in $GF(2^m)$. $\zeta^{(2t-1)}(x)$ and $B^{(2t-1)}(x)$ are the polynomials $\zeta(x)$ and $B(x)$ in the algorithm of FIG. 8 at step $2t-1$.

However, not all choices of $\Delta$ will result in a legitimate ELP $\Lambda(x)$. A legitimate ELP will be one which follows the following rules: Has t+1 zeros, All zeros correspond to elements that point to a bit within the codeword.

Figure 9:
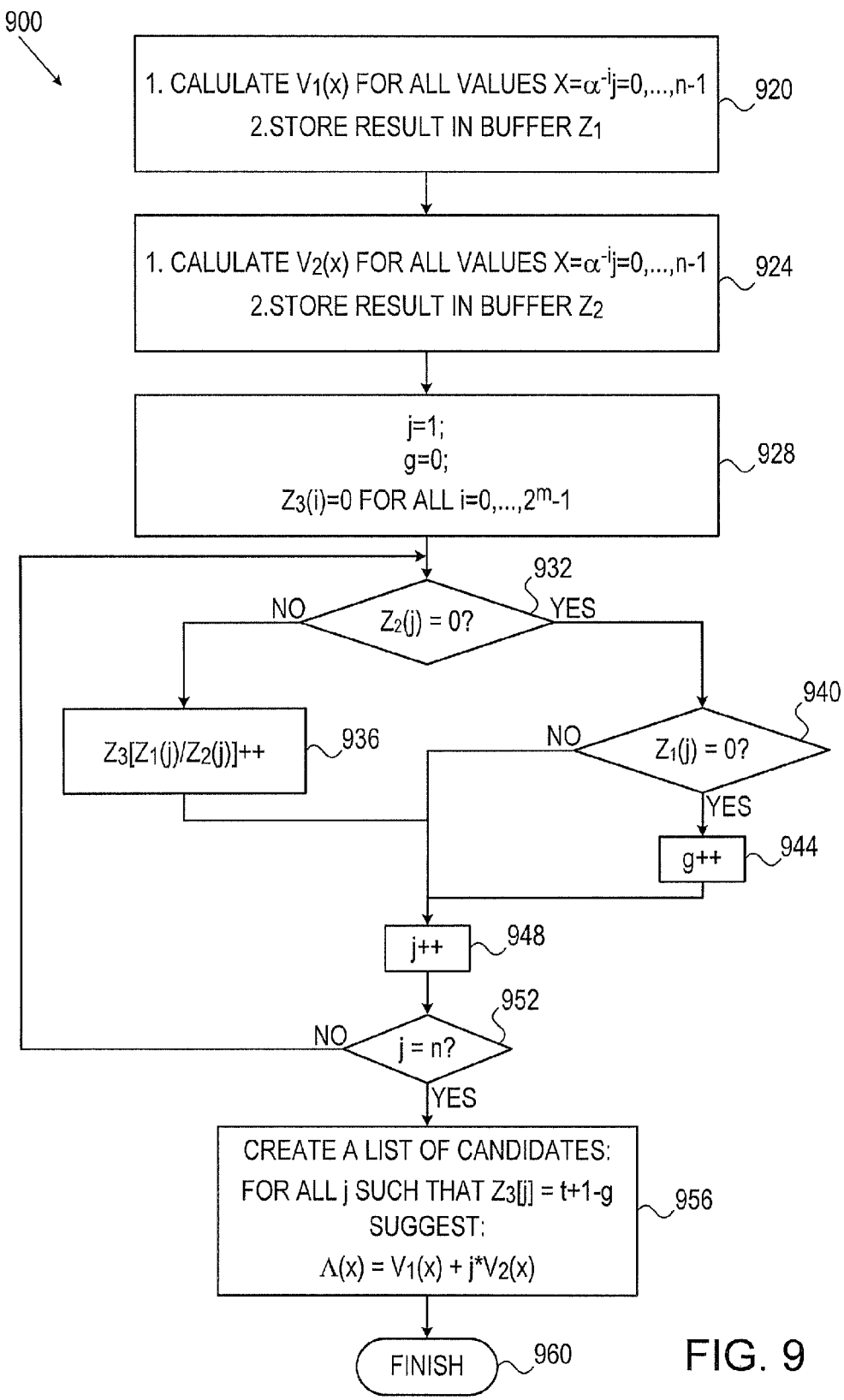
FIG. 9 illustrates a t+1 correction scheme, according to an embodiment of the invention.

FIG. 9 and table 3 illustrate a method with complexity linear in the length of the codeword that can locate relevant ELPs which follow the above rules. The method calculates the polynomials $V_1(x)$ and $V_2(x)$ at all possible bit locations (i.e., $x=\alpha^{-i}$, $i=0 \ldots n-1$ where n is the codeword length).

By calculating the proportion $$\frac{V_1(x)}{V_2(x)}$$

the value of $\Delta$ which nullifies the ELP is found. By calculating a histogram of those $\Delta$s which result in t+1 errors, it is possible to find suitable candidate solutions. In FIG. 9 the case in which $V_2(x)=0$ is also defined.

It is noted that all of the two-dimensional decoding processes described in this specification are applicable to p-dimensional codes, where p exceeds two.

TABLE 3

| stage | Next stage | Next stage if yes | Next stage if no |
|---|---|---|---|
| 920 Calculate $V_1(x)$ for all values $x = \alpha^{-i}$, $i = 0, \ldots, n-1$, and store results in buffer $Z_1$ | 924 | | |
| 924 Calculate $V_2(x)$ for all values $x = \alpha^{-i}$, $i = 0, \ldots, n-1$, and store results in buffer $Z_2$ | 928 | | |
| 928 J = 1; g = 0; $Z_3(i) = 0$ for all $i = 0, \ldots, 2^n - 1$ | 932 | | |

TABLE 3-continued

| stage | | Next stage | Next stage if yes | Next stage if no |
|---|---|---|---|---|
| 932 | $Z_2(j) = 0$? | | 940 | 936 |
| 936 | Increase $Z_3[Z_1(j)/Z_2(j)]$ | 948 | | |
| 940 | $Z_1(j) = 0$? | | 944 | 948 |
| 944 | Increase g | 948 | | |
| 948 | Increase j | 952 | | |
| 952 | $J = n$? | | 956 | 932 |
| 956 | Create a list of candidates: for all j such as $Z_3(j) = t + 1 - g$ suggest: $\Lambda(x) = V_1(x) + J^* V_2(x)$ | 960 | | |
| 960 | Finish | | | |

There are BCH component codes, for which the miss-correction probability is non negligible. An example for such codes is a BCH code with T=1, and length equal to $2^m-1$, where m is the field size (which is also known as a perfect code). In such cases it is required to take measures in order to decrease the probability of false miss-correction through the iterative decoding, especially since by code design it is expected that some component codes will not always be correctable on first iteration, and first dimension.

Figure 10:
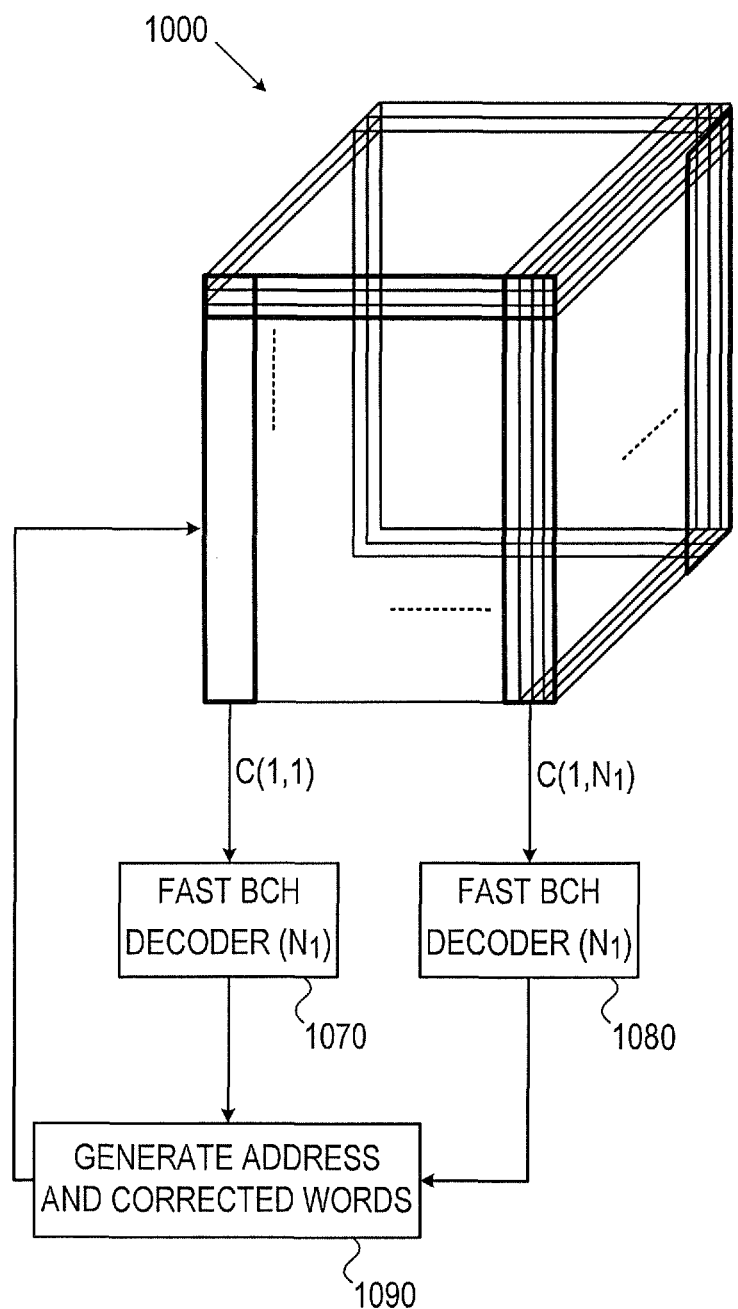
FIG. 10 illustrates an exemplary decoding step, according to an embodiment of the invention.

FIG. 10 exemplifies a decoding step in the iterative decoding process of multi-dimensional codes. All component codes of the same dimension can be simultaneously decoded, their resulting error vector can be applied to systematic bits. Then the next dimension can be decoded. In case the corrections of the previous dimension were applied, the decoding of next dimension benefits from those corrections, and the probability for successful decoding grows. As discussed later in this section, the located errors of the decoders for a certain dimension are not always applied, e.g. when performing majority decision iterations. In FIG. 10 two fast BCH decoders 1070 and 1080 are applied on two codewords of a three dimensional code 1000. The outcome of these decoding processes is a corrected codewords and an address, as illustrated by box 1090.

Figure 11:
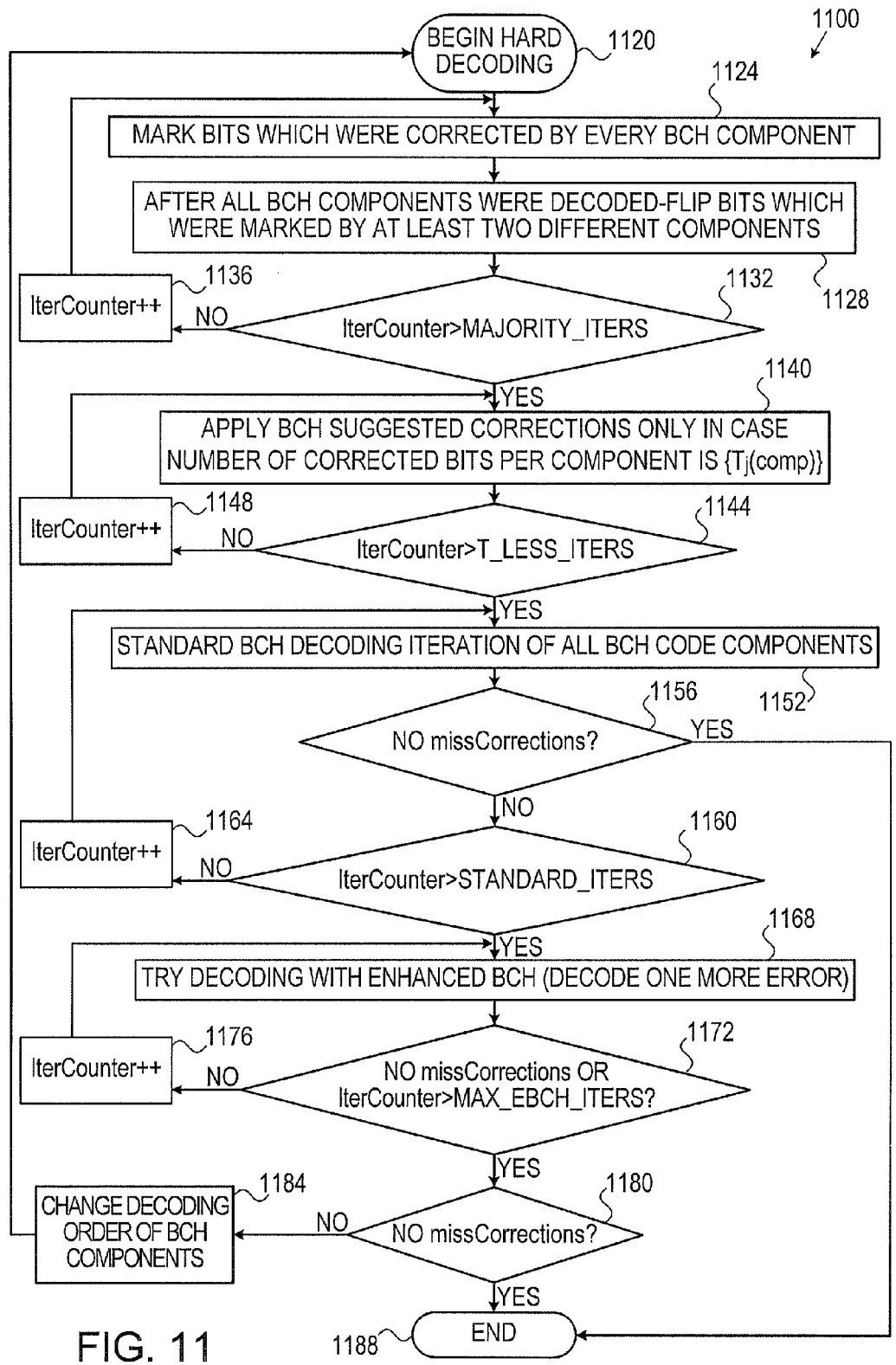
FIG. 11 illustrates an iterative hard decoding flow, according to an embodiment of the invention.

FIG. 11 describes a method that is executed by an iterative hard decoder. A basic iteration includes decoding of all the component codes, as explained earlier, for each dimension. At the first few iterations a majority decision error correction is used, in order to reduce probability of false corrections. These first iterations are represented by stages 1124-1132.

Then, in the next few iterations, the error correction is applied for every component code, however the number of corrections to be applied is restricted according to the code spectrum. These iterations are represented by stages 1140 and 1148.

Following decoding iterations include conventional BCH decoding processes per component, and applying the suggested corrections for every component code. In case that the number of iterations exceeds a certain threshold (denoted STANDARD_ITERS), the decoder tries to decode. These following decoding iterations are represented by stages 1152-1160.

These conventional BCH decoding processes can be followed by enhanced BCH decoding processes—in which an additional error may be amended for each BCH component, as illustrated by stages 1168 and 1178. An enhanced BCH decoding process is illustrated in FIG. 9.

If these iterations did not yield successful decoding then the order of decoding dimensions may be changed (stage 1184) and the iterations may start over.

In general, the decoding may stop immediately after the information bits are successfully recovered. This can be implemented for example by using a CRC on the data, and checking the CRC validity after every iteration.

The number of allowed iterations is set in advance. Thresholds MAJORITY_ITER, T_LESS_ITER, STANDARD_ITERS and MAX_EBCH_ITER set the maximal allowable number of each set of iterations.

It is noted that although FIG. 11 illustrates method 1100 as including stages 1120-118 this is not necessarily so. For example, it may include only one or more of the following set of stages: (i) stages 1124-1132, (ii) 1140-1144, (iii) 1152-1160, and (iv) 1168-1172.

TABLE 4

| stage | | Next stage | Next stage if yes | Next stage if no |
|---|---|---|---|---|
| 1120 | Begin hard decoding | 1124 | | |
| 1124 | Mark bits which were corrected by every BCH component | 1128 | | |
| 1128 | After all BCH components were decoded - flip bits that were marked by at least two (or a majority of) different decoding processes | 1132 | | |
| 1132 | Number of iterations (InterCounter) > MAJORITY_ITERS? | | 1140 | 1136 |
| 1136 | Increase InterCounter | 1124 | | |
| 1140 | Apply BCH suggested corrections only in case that number if corrected bits per component is $\{T_i(comp)\}$. $T_i(comp)$ is a threshold per iteration and per component. This threshold is derived from the code spectrum of each component code. | 1144 | | |
| 1144 | InterCounter > T_LESS_ITERS? | | 1152 | 1148 |
| 1148 | Increase InterCounter | 1140 | | |
| 1152 | Perform standard BCH decoding of all BCH code components | 1152 | | |
| 1156 | No miss-corrections? | | 1188 | 1160 |
| 1160 | InterCounter > STANDARD_ITERS? | | 1168 | 1164 |
| 1164 | Increase InterCounter | 1152 | | |
| 1168 | Try decoding with enhanced BCH (decode one more error) | 1172 | | |
| 1172 | No miss-correction OR InterCounter > MAX_EBCC_ITER? | | 1180 | 1176 |
| 1176 | Increase InterCounter | 1168 | | |
| 1180 | No miss-correction? | | 1188 | 1182 |
| 1182 | Is another decoding order possible? | | 1184 | 1188 |
| 1184 | Change decoding order of the different dimensions (of the multi-dimensional code). For example, in a 2D code there are only two possible orderings, with 3D there are more than 6 possible orderings, etc. | 1120 | | |
| 1188 | END | | | |

On the first few iterations a majority decision error correction is used, in order to reduce probability of false miss-corrections. These few iterations provide a first decoding pass which does not apply the suggested BCH corrections on the input stream, but only marks their locations. More precisely, for every suggested correction save in a separate buffer the number of component codes which suggested this correction. Since multi-dimensional codes are used, every input bit is encoded by multiple codes (the number of codes is equal to the number of dimensions). Therefore, applying a bit-flip only to those bits which were suggested by a majority of component decoders, or by more than a certain threshold (not necessarily the majority of decoders) may increase the reliability of corrections, and overcome the problem of false miss-corrections.

A simple extension, which is suggested here, is to apply corrections not only to locations with sufficiently high scores, but also to all suggested corrections which are associated with the decoding processes that had high score locations. This is since the overlap between component codes on different dimension is usually small, depending on the folding ratio. Thus, the reliability of a suggested correction is already increased by requiring that its score will be greater than 1.

For the initial iterations, after the majority decision iterations, it is suggested to take further steps which reduce the probability of false corrections. Every component code has a code spectrum, which can be utilized for this purpose. Define a probability distribution, P(n,e), where T≥n≥0 is the number of (falsely) detected errors after the BCH decoding, and e is number of input errors.

The case that BCH components are uncorrectable is of interest in the context of miss-corrections, then it can be assumed that e>T, where T is the number of errors according to the BCH bound. After decoding a BCH component code, with e>T, there will be additional errors according to $$P_n(m) = \sum_{e=T+1}^{N} P(m, e),$$

where N is the code length (including parity) of a component code.

Accordingly, an iterative decoding iteration can be provided which restricts decoding to correction of only m errors, for values of m for which $P_n(m)$ is sufficiently small.

At the expense of performing many iterations, the reliability of decoding can increase, since the more iterations with reliable decoding (and low rate of false miss-corrections) the higher is the probability for successful decoding.

Sometimes the decoding order of the different dimension may influence the final result (success/failure). This is once again a result of false miss-corrections. Consider for example a 3D code where the code on D1 (the first dimension) is relatively a strong code, i.e. low false correction probability. Then a decoding order of [d1,d2,d3] will not always be optimal, and there may be cases where a decoding order of [d1, d2, d1, d3] or [d1,d3,d1,d2] will be more efficient.

Figure 12:
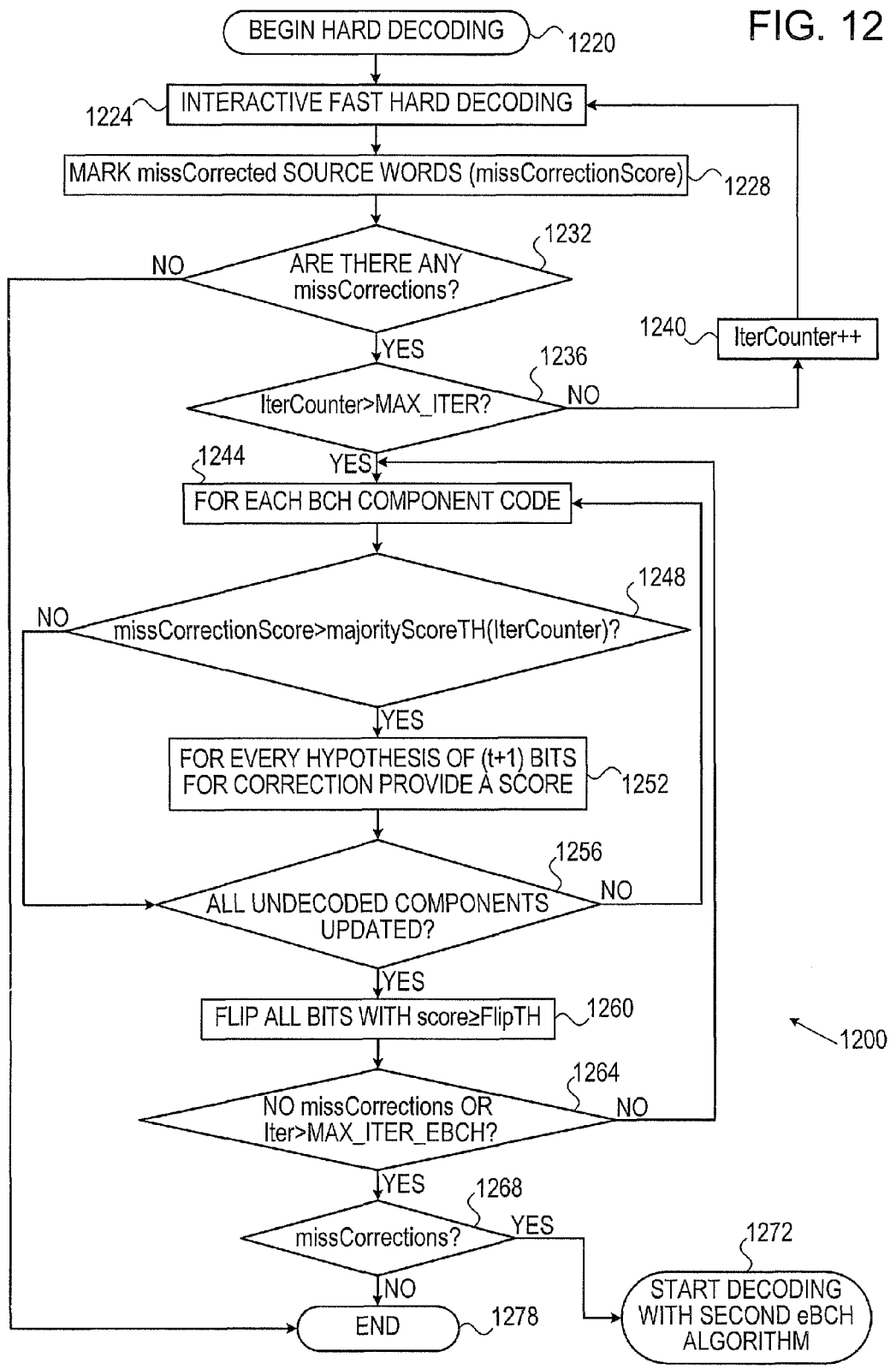
FIG. 12 illustrates an iterative decoding with enhanced BCH algorithm, according to an embodiment of the invention.

FIG. 12 and Table 5 illustrate a decoding process 1200 that benefits from performing multiple iterations of decoding processes.

First initialize a final score matrix S with zeros, and let the matrix be of the exact size of the input information matrix. The first stage here to perform fast decoding adhering to the iterative hard decoding described in previous sections. During every iteration, a score matrix M is created. Every entry in M is denoted missCorrectionScore, and specifies the number of component codes reporting miss-correction on this entry.

When the number of fast decoding exceeds MAX_ITERS, the enhanced BCH decoding begins. For each BCH component, the enhanced BCH is attempted only if there are entries for this codeword in M which received a score greater than the thresholds denoted majorityScoreTH of the current iteration. If true, every candidate increments by 1 its corresponding entries in S.

Finally, after going over all candidates, the bits to be flipped correspond to those entries in S with score greater than the threshold FilpTH. This process is repeated until there are no further errors, or until a maximal number of iterations is reached.

TABLE 5

| stage | | Next stage | Next stage if yes | Next stage if no |
|---|---|---|---|---|
| 1220 | Begin hard decoding | 1224 | | |
| 1224 | Perform iterative fast hard decoding. Fast hard decoding in this context means that enhanced BCH is not used - thus only t instead of t + 1 errors can be corrected by every BCH component. | 1228 | | |
| 1228 | Mark miss-corrected bits | 1232 | | |
| 1232 | Are there any miss-corrections? | | 1236 | 1276 |
| 1236 | InterCounter > MAX_ITER? | | 1244 | 1240 |
| 1240 | increase InterCounter | 1224 | | |
| 1244 | Iterate for each BCH component code | 1248 | | |
| 1248 | missCorrectionScore > MajorityScoreTH? | | 1252 | 1256 |
| 1252 | For every hypothesis of (t + 1) bits for correction provide a score | 1256 | | |
| 1256 | All un-decoded components updated? | | 1260 | 1244 |
| 1260 | Flip all bits with score ≥ FlipTH | 1264 | | |
| 1264 | No miss-correction OR InterCounter > MAX_ITER_EBCH? | 1268 | | |
| 1268 | Miss-corrections? | | 1272 | 1276 |
| 1272 | Start decoding with a second enhanced BCH algorithm | | | |
| 1276 | END | | | |

Method 1300 of FIG. 13 starts by performing a fast decoding adhering to the iterative hard decoding described in previously. During every iteration, a score matrix M is created. Every entry in M is denoted missCorrectionScore, and specifies the number of component codes reporting miss-correction on this entry.

When the number of fast decoding exceeds MAX_ITERS, the enhanced BCH decoding begins. For each BCH component, the enhanced BCH is attempted only if there are entries for this codeword in M which received a score greater than the thresholds denoted majorityScoreTH of the current iteration. If true, enhanced BCH is applied resulting with potentially multiple candidates. Then a candidate is selected only if there exists a single (unique) candidate which contains locations with associated missCorrectionScore (in M) greater than a predetermined threshold. This process is repeated until there are no further errors, or until a maximal number of iterations is reached.

TABLE 6

| stage | | Next stage | Next stage if yes | Next stage if no |
|---|---|---|---|---|
| 1320 | Begin hard decoding | 1324 | | |
| 1324 | Perform iterative fast hard decoding (where fast hard decoding means that enhanced BCH is not used - thus only T instead of T + 1 errors can be corrected by every BCH component). | 1328 | | |
| 1328 | Mark miss-corrected source words. Source words are information (systematic) bits | 1332 | | |
| 1332 | Are there any miss-corrections? | | 1336 | 1372 |
| 1336 | InterCounter > MAX_ITER? | | 1344 | 1340 |
| 1340 | increase InterCounter | 1324 | | |
| 1344 | Iterate for each BCH component code | 1348 | | |
| 1348 | missCorrectionScore > MajorityScoreTH? | | 1352 | 1364 |
| 1352 | Perform enhanced BCH decoding | 1356 | | |
| 1356 | Is there a single hypothesis (missCorrectionScore > MajorityScoreTH)? | | 1360 | 1344 |
| 1360 | Flip associated (T + 1) bits for correction. | 1364 | | |
| 1364 | All un-decoded components updated? | | 1368 | 1344 |
| 1368 | No miss-corrections OR IterCounter ≥ MAX_ITER_EBCH? | | 1372 | 1376 |
| 1372 | END | | | |

The methods of FIG. 12 and FIG. 13 may be combined into one iterative process, where failure of first algorithm leads to invoking the second algorithm.

When both hard and soft decoding are used, it might not be advisable to use the enhanced BCH decoding, as it can be used for hard decoding only, and its improvement is usually more dramatic in cases of low frame error rate (FER), by achieving a steeper FER slope. Obviously, it depends on the system design parameters, which determine the working points.

According to the FER working point which will be the trigger for switching the decoding strategy from hard decoding to soft decoding, the additional benefit of enhanced BCH should be evaluated. The additional efficiency of correcting T+1, versus the implementation complexity should be weighed according to the specific system and components code which are used.

According to an embodiment of the invention a sub-optimal soft decoder can be used for some or all BCH components. Since the number of corrected errors increases to t+n, where n is the number of enumeration bits for soft decoding. The price of false correction can be severe here since a false correction may invert t+n bits, which will add on to the existing errors of a codeword.

FIG. 14 and table 7 illustrate a soft decoding method.

corrected bits. In case the sum-LLR, denoted by outLLR is greater than some threshold, it can be suspected to be a false correction.

This property is used in the iterative soft decoding process, to minimize the false correction probability at the expense of higher latency decoding (by multiple iterations). The threshold for outLLR, denoted by LLR_TH(iterCounter) is slightly increased every iteration, to allow more and more corrections to be applied, while minimizing false corrections.

In order to increase the convergence rate of the soft decoder with increasing LLR thresholds, it is advisable to use a set of fast increasing thresholds for LLR_TH(iterCounter), and only in cases of unsuccessful decoding after a maximal number of iterations, repeat the process with a different LLR_TH set, which increases much slower per iteration.

This allows reducing the average number of iterations for soft decoding, which is efficient in terms of power consumption for hardware implementation.

According to an embodiment of the invention a reduction of the average decoding latency can be achieved by varying the decoding complexity according to the decoding success. The parameters to control are the number of bits for enumeration in the sub-optimal soft decoding, and the error-span for each enumerated bit. That is, by using only few bits (e.g. 3) for enumeration and fixing a small error-span. The error-span is

TABLE 7

| stage | | Next stage | Next stage if yes | Next stage if no |
|---|---|---|---|---|
| 1420 | Begin soft decoding | 1424 | | |
| 1424 | Config.: (i) number of bits for enumeration, (ii) error span per bit enumeration, (iii)LLR thresholds | 1428 | | |
| 1428 | Iterate over each BCH component code with t ≤ m | 1432 | | |
| 1432 | Perform sub-optimal soft decoding. Sub-optimal in the sense that this is not a maximum likelihood decoding - the limited enumeration creates a sphere around the initial hard decision, from which the most likely codeword is selected. This is definitely sub-optimal, since in case of many errors there is a high probability that the sphere will not include the correct codeword. That means that the maximum likelihood (which is impractical) would probably have resulted in a different candidate. | 1436 | | |
| 1436 | Abs(outLLR) < LLR_TH(iter_Counter)? This stage ("Is the likelihood ratio of the soft decoder output smaller than a threshold?") involves comparing (i) an absolute value of the log likelihood ratio (LLR) output that is the sum of LLRs of the inverted bits to (ii) a threshold. If this sum is small compared to the threshold there is a smaller chance for miss correction, since unreliable bits are inverted. The threshold is a function of iteration count, such that it will increase as iteration count increases. This amounts to performing the more likely corrections at first few iterations. | | 1440 | 1444 |
| 1440 | Update soft decoder output for current BCH component. A BCH code component can be for example in FIG. 2A any one of 130(1) . . . 130(4), Inner Code 1, . . . , Inner Code 8. | 1444 | | |
| 1444 | No miss-corrections OR IterCounter ≥ MAX_ITER? | | 1452 | 1448 |
| 1448 | END | 1424 | | |

The soft decoding of a BCH component code does not solely rely on the miss-correction indication from the BCH decoder. False corrections can be reduced by accounting for the reliability of the corrected codeword. In other words, since there is an LLR value per bit, the metric of the corrected codeword can be approximated by the sum of LLRs of the defined as the number of bits p with smallest absolute value of LLRs. The decoding complexity is determined by the product of error-spans for all enumerated bits.

On first soft decoding attempt, few bits are used with small enumeration spans, then in case of decoding failure the span is increased, or the number of enumerated bits (or both) is increased and iterative decoding is attempted once again. The average implementation complexity can be considerably reduced here.

Enhanced BCH decoders can be used to provide multiple candidates, and the likely candidate can be selected according to its sum-LLR. The methods of multi-dimensional decoding aided selection, as described for hard decoding, may as well be applied here.

Care is to be taken here, as the complexity of the enhanced BCH decoder is linear with the length of the code, this may sometimes be impractical for soft decoding for multiple enumeration bits.

According to an embodiment of the invention, a multi-dimensional code may have a growing codeword size with the number of dimensions. The motivation of such design is to enable graceful degradation of the latency in decoding as function of the input SNR. That is, in case there are few errors, only the code of the first dimension operates. With more errors, it would be possible to iteratively decode two dimensions, and only if this fails, the third dimension codewords are used.

Figure 15:
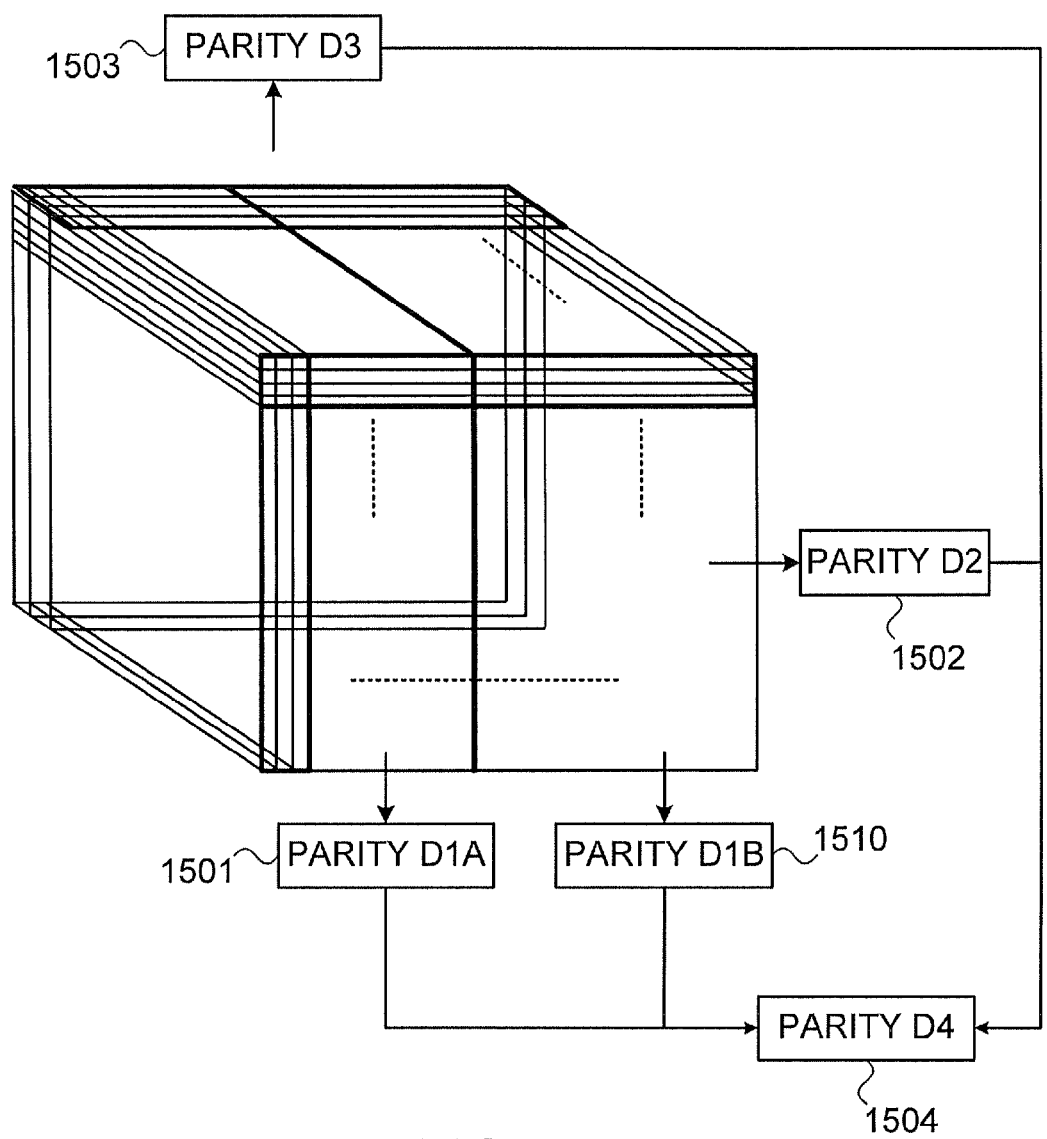
FIG. 15 illustrates a multidimensional code according to an embodiment of the invention.

FIG. 15 illustrates a multidimensional code according to an embodiment of the invention.

FIG. 15 illustrates a cube of information bits. The information bits are encoded by multiple component codes in each dimension. Every component code may capture a whole plane or multiple planes. In this new construction the component codes which generate parity bits denoted by D1A capture multiple half planes. The codes for other dimensions (generating Parity D2 and D3) capture multiple (full) planes each. There may be cases where only a small fraction of the information bits need to be retrieved (e.g. read of a single sector from memory where the codeword consists of several sectors).

The special coding structure enables gradually increasing the number of bits to be fetched from memory for decoding, depending on the number or errors. Assume that only a few bytes of the component in D2 are requested. The decoding process is as follows:
  a. Read from memory the bits the first component code in D2 and its parity bits (also denoted outer codeword).
  b. If decoding succeeds—end. Otherwise, go to next step.
  c. Read from memory all bits associated with Parity D1A, and the relevant parity bits from Parity D2. This corresponds, in the example, to less than half of the whole codeword.
  d. Perform iterative decoding in two dimensions (D1 and D2), like described in this disclosure.
  e. If decoding succeeds—end. Otherwise, go to next step.
  f. Read from memory the rest of the information and parity bits.
  g. Perform 3D iterative decoding, until desired codeword is successfully retrieved. Otherwise declare on a failure.

Implementation Issues

One property of multi-dimensional codes for high rates when using folded BCH is the possibility of using components with only few error correction capability, e.g. codes with T≤4. For such component codes a Chien search for BCH decoding is not necessary, and by solving a polynomial equation of order smaller or equal to 4 over $GF(2^m)$ is possible. It is known that solutions for quadratic, cubic and quadratic equations over $GF(2^m)$ is possible. This may considerably reduce the implementation complexity of a multi-dimensional iterative decoder.

In some applications, such as encoding for Nand Flash devices, the channel output can be either hard output or soft output. However, in order to obtain soft output multiple read operations have to be carried out, and this generally degrades the read time performance, regardless of the decoding time. Therefore some applications may consider designing systems with hard decoding until the device performance deteriorates, and only then perform soft decoding. In such applications it may be useful to use BCH codes with T≤4, and then apply soft decoding over all dimensions.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly with the ECC component.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. An encoding method, the method comprising: receiving data; generating a set of first codewords by applying a first encoding process on the received data; and performing a second encoding process on a folded version of each first codeword or on a folded version of the received data to provide a set of second codewords, wherein the second codeword comprises redundancy bits.

2. The method according to claim 1 comprising storing each first codeword in multiple columns of a memory space; and performing the second encoding process on rows of the memory space.

3. The method according to claim 1 wherein the first error encoding process differs from the second encoding process.

4. The method according to claim 1 wherein at least two first codewords have different lengths.

5. The method according to claim 1 comprising configuring an error correction capability of at least one of the first and second encoding processes based on a desired error correction capability.

6. The method according to claim 1 comprising performing a third encoding process on a folded version of each second codeword to provide a set of third codewords.

7. The method according to claim 6 wherein the first, second and third error encoding process differ from each other.

8. The method according to claim 6 wherein at least two codewords out of different sets of codewords have different lengths.

9. The method according to claim 1 wherein at least two codewords of the same set of codeword have different lengths.

10. The method according to claim 1 comprising performing at least four encoding processes, wherein each encoding process except a first encoding process is applied on a folded version of a set of codewords obtained by applying a previous encoding process.

11. The method according to claim 1 comprising performing at least three encoding processes, wherein each encoding process except a first encoding process is applied on a folded version of a set of codewords obtained by applying a previous encoding process, wherein at least one encoding process is applied only on redundancy bits generated by previous encoding processes.

12. The method according to claim 1 comprising performing at least three encoding processes, wherein each encoding process except a first encoding process is applied on a folded version of a set of codewords obtained by applying a previous encoding process, wherein at least two encoding processes differ from each other.

13. The method according to claim 1 comprising generating the set of first codewords by a first encoder, providing the first codewords to a second encoder, and performing a second encoding process by a second encoder; wherein the second encoder starts to perform the second encoding process before the first encoder finished to generate a sub-set of the first codewords.

14. The method according to claim 13 comprising generating the set of first codewords by a first linear feedback shift register of the first encoder, providing first codeword chunks to a second liner feedback shift register of the second encoder, and performing a second encoding process by a second encoder.

15. The method according to claim 1 wherein each first codeword is arranged in a set of consecutive columns of a matrix; wherein the method comprises filling registers that correspond to rows of the matrix and performing the second encoding process on rows of the matrix.

16. The method according to claim 1 comprising generating the set of first codewords by a first encoder, wherein a folded version of a first codeword is arranged in a set of consecutive columns of a matrix; filling registers of a second encoder, wherein the registers correspond to rows of the matrix and performing the second decoding process on rows of the matrix by the second encoder.

17. The method according to claim 1 comprising configuring configurable linear feedback shift registers according to an encoding parameter of an encoding process selected from the first and second encoding processes.

18. The method according to claim 1 comprising storing the set of second codewords in a flash memory; reading a content of the flash memory; and applying a decoding process on the content of the flash memory.

19. A decoding method, the method comprises: receiving information that comprises a final set of codewords that undergone an error inducing process; reconstructing data by applying on the information a first decoding process to provide first results; and applying a second decoding process on folded versions of first results or on folded versions of the information to provide second results.

20. The method according to claim 19 comprising storing each first result in multiple columns of a memory space; and performing the second decoding process on rows of the memory space.

21. The method according to claim 19 wherein the first error encoding process differs from the second encoding process.

22. The method according to claim 19 wherein at least two first results have different lengths.

23. The method according to claim 19 comprising configuring an error correction capability of at least one of the first and second decoding processes based on a desired error correction capability.

24. The method according to claim 19 comprising performing a third decoding process on a folded version of each second result to provide a set of third results.

25. The method according to claim 24 wherein the first, second and third error decoding process differ from each other.

26. The method according to claim 24 wherein at least two results out of different sets of results have different lengths.

27. The method according to claim 19 wherein at least two results of the same set of result have different lengths.

28. The method according to claim 19 comprising performing at least four decoding processes, wherein each decoding process except a first decoding process is applied on a folded version of a set of results obtained by applying a previous decoding process.

29. The method according to claim 19 comprising performing at least three decoding processes, wherein each decoding process except a first decoding process is applied on a folded version of a set of results obtained by applying a previous decoding process, wherein at least one decoding process is applied only on redundancy bits generated by previous decoding processes.

30. The method according to claim 19 comprising performing at least three decoding processes, wherein each decoding process except a first decoding process is applied on a folded version of a set of results obtained by applying a previous decoding process, wherein at least two decoding processes differ from each other.

31. The method according to claim 19 comprising performing at least two decoding processes, wherein at least one decoding process is followed by determining whether to ignore the results of the decoding process.

32. The method according to claim 31 comprising ignoring the results of an ignored decoding process by applying a next decoding process on a folded version of each result of a decoding process that preceded the ignored decoding process.

33. The method according to claim 31 comprising determining to ignore the results of the decoding process if detecting a miss correction.

34. The method according to claim 31 comprising ignoring the results of the first decoding process by applying the second decoding process on a folded version of the information.

35. The method according to claim 19 comprising performing at least two decoding processes, wherein at least one decoding process is followed by determining whether to skip at least one decoding process that follows the decoding process.

36. The method according to claim 19 comprising determining to skip at least one decoding process if at least one decoding process that preceded the determination provided a result of a desired characteristic.

37. The method according to claim 31 comprising ignoring the results of an ignored decoding process by applying a next decoding process on a folded version of each result of a decoding process that preceded the ignored decoding process.

38. The method according to claim 19 comprising preventing a modification of at least one bit of a result by at least one decoding process if determining by at least one preceding decoding process that the at least one bit is correct.

39. The method according to claim 19 comprising performing an error location search of a decoding process in response to error locations that were found during a previous decoding process.

40. The method according to claim 19 comprising generating, for each information bit out of multiple information bits, multiple indications about a correctness of the information bit, wherein the generating comprises applying multiple decoding processes out of a group of information bits; and determining whether to modify each information bit based upon multiple indications associated with the information bit.

41. The method according to claim 19 comprising generating, for each information bit out of multiple information bits, multiple indications about a correctness of the information bit, wherein the generating comprises applying multiple decoding processes out of a group of information bits; and determining whether to modify each information bit based upon a majority of indications associated with the information bit.

42. The method according to claim 19 comprising generating, for each information bit out of multiple information bits, multiple indications about a correctness of the information bit, wherein the generating comprises applying multiple decoding processes out of a group of information bits; and determining to modify each information bit if at least a predetermined number of indications associated with the information bit indicate that the bit is not correct.

43. The method according to claim 19 comprising generating, for each information bit out of multiple information bits, multiple indications about a correctness of the information bit, wherein the generating comprises applying multiple decoding processes out of a group of information bits; and determining whether to modify each information bit based upon confidence levels of different indications associated with the information bit.

44. The method according to claim 19 wherein each decoding process is characterized by correction threshold; wherein the method comprises preventing a modification of information bits if a decoding process indicates that errors occurred in more information bits than the correction threshold of the decoding process.

45. The method according to claim 19 comprising performing multiple iterations of multiple decoding processes.

46. The method according to claim 19 comprising performing an iteration of multiple decoding processes while allowing a correction of up to a predefined number of corrections; altering the predefined number of corrections; and performing another iteration of multiple decoding processes while allowing a correction of up to an altered predefined amount of corrections.

47. The method according to claim 19 comprising performing multiple iterations of decoding processes to provide multiple decoding iteration results; wherein the decoding iterations differ from each other; and selecting a selected decoding iteration result out of the multiple decoding iterations results.

48. The method according to claim 19 comprising performing a first iteration of decoding processes to provide a first decoding iteration result; and performing a second iteration of second processes if the first decoding iteration result does not satisfy a predefined criteria.

49. The method according to claim 19 comprising performing a first iteration of decoding processes to provide a first decoding iteration result; and performing a second iteration of second processes if the first decoding iteration failed.

50. The method according to claim 19 comprising performing multiple iterations of decoding processes wherein at least one iteration of decoding processes comprises multiple instances of a single decoding process.

51. A system that comprises an encoding unit and a two dimensional memory array; wherein the encoding unit is configured to receive a data; generate a set of first codewords by applying a first encoding process on the received data; and perform a second encoding process on a folded version of each first codeword to provide a set of second codewords, wherein the set of second codewords facilitates an error correction encoding of the data.

52. The method according to claim 51 wherein the two dimensional memory array is configured to store each first codeword in multiple columns of the two dimensional memory array; and wherein the encoding unit is configured to perform the second encoding process on rows of the two dimensional memory array.

53. The system according to claim 51 wherein the first error encoding process differs from the second encoding process.

54. The system according to claim 51 wherein at least two first codewords have different lengths.

55. The system according to claim 51 wherein the encoding unit is configured to adjust an error correction capability of at least one of the first and second encoding processes based on a desired error correction capability.

56. The system according to claim 51 wherein the encoding unit is configured to perform a third encoding process on a folded version of each second codeword to provide a set of third codewords.

57. The system according to claim 56 wherein the encoding unit is configured to perform first, second and third error encoding processes that differ from each other.

58. The system according to claim 56 wherein at least two codewords out of different sets of codewords have different lengths.

59. The system according to claim 51 wherein at least two codewords of the same set of codeword have different lengths.

60. The system according to claim 51 wherein the encoding unit is configured to perform at least four encoding processes, wherein the encoding unit is configured to perform each encoding process except a first encoding process is applied on a folded version of a set of codewords obtained by applying a previous encoding process.

61. The system according to claim 51 wherein the encoding unit is configured to perform at least three encoding processes, wherein the encoding unit is configured to apply each encoding process except a first encoding process on a folded version of a set of codewords obtained by applying a previous encoding process, wherein the encoding unit is configured to apply at least one encoding process only on redundancy bits generated by previous encoding processes.

62. The system according to claim 51 wherein the encoding unit is configured to perform at least three encoding processes, wherein each encoding process except a first encoding process is applied on a folded version of a set of codewords obtained by applying a previous encoding process, wherein at least two encoding processes differ from each other.

63. The system according to claim 51 wherein the encoding unit comprises a first encoder and a second encoder; wherein the first encoder is configured to generate the set of first codewords, provide the first codewords to the second encoder, and wherein the second encoder is configured to perform a second encoding process; wherein the second encoder starts to perform the second encoding process before the first encoder finished to generate a sub-set of the first codewords.

64. The system according to claim 63 wherein a first linear feedback shift register of the first encoder is configured to generate the set of first, provide first codeword chunks to a second linear feedback shift register of the second encoder, and wherein the second encoder performs the second encoding.

65. The system according to claim 51 wherein each first codeword is arranged in a set of consecutive columns of a matrix; wherein the encoding unit comprises a second encoder that comprises registers correspond to rows of the matrix; wherein the second encoder is configured to fill these registers and process the content of the registers.

66. The system according to claim 51 wherein the encoding unit comprises a first encoder and a second encoder; wherein the first encoder is configured to generate the set of first codewords, wherein a folder version of a first codeword is arranged in a set of consecutive columns of a matrix; wherein the second encoder comprises registers that correspond to rows of the matrix; wherein the second encoder is configured to perform the second decoding process on rows of the matrix by the second encoder.

67. The system according to claim 51 wherein the encoding unit comprises multiple configurable linear feedback shift registers that are configurable according to an encoding parameter of an encoding process selected from the first and second encoding processes.

68. The system according to claim 51 comprising a flash memory configured to store the set of second codewords in a flash memory; and a memory controller configured to read a content of the flash memory; wherein the decoding unit is configured to applying multiple decoding processes on the content of the flash memory.

69. A system that comprises a decoder and a two dimensional memory unit, the decoder is configured to receive information that comprises a final set of codewords that undergone an error inducing process; reconstruct data by applying on the information a first decoding process to provide first results; and apply a second decoding process on folded versions of first results to provide second results.

70. The system according to claim 69 wherein the two dimensional memory unit is configured to store each first result is stored in multiple columns; wherein the decoder is configured to perform the second decoding process on rows of the two dimensional memory unit.

71. The system according to claim 69 wherein the first error encoding process differs from the second encoding process.

72. The system according to claim 69 wherein at least two first results have different lengths.

73. The system according to claim 69 wherein the decoder is configured to apply decoding processes of configurable error correction capability; wherein the configurable error correction capabilities are determined based on a desired error correction capability.

74. The system according to claim 69 wherein the decoder is adapted perform a third decoding process on a folded version of each second result to provide a set of third results, wherein a folded version of a second result is representative of a storage of the second result in a two dimensional memory space.

75. The system according to claim 74 wherein the first, second and third error decoding process differ from each other.

76. The system according to claim 74 wherein at least two results out of different sets of results have different lengths.

77. The system according to claim 69 wherein at least two results of the same set of results have different lengths.

78. The system according to claim 69 wherein the decoder is configured to perform at least four decoding processes, wherein each decoding process except a first decoding process is applied on a folded version of a set of results obtained by applying a previous decoding process.

79. The system according to claim 69 wherein the decoder is configured to perform at least three decoding processes, wherein the decoder is configured to apply each decoding process except a first decoding process on a folded version of a set of results obtained by applying a previous decoding process, wherein the decoder is configured to apply at least one decoding process only on redundancy bits generated by previous decoding processes.

80. The system according to claim 69 wherein the decoder is configured to perform at least three decoding processes, wherein the decoder is configured to apply each decoding process except a first decoding process on a folded version of a set of results obtained by applying a previous decoding process, wherein at least two decoding processes differ from each other.

81. The system according to claim 69 wherein the decoder is configured to perform at least two decoding processes, wherein the decoder is configured to determine, after completing at least one decoding process, whether to ignore the results of the decoding process.

82. The system according to claim 81 wherein the decoder is configured to ignore the results of an ignored decoding process by applying a next decoding process on a folded version of each result of a decoding process that preceded the ignored decoding process.

83. The system according to claim 81 wherein the decoder is configured to determine to ignore the results of the decoding process if detecting a miss correction.

84. The system according to claim 81 wherein the decoder is configured to ignore the results of the first decoding process by applying the second decoding process on a folded version of the information.

85. The system according to claim 69 wherein the decoder is configured to perform at least two decoding processes and to determine whether to skip at least one decoding process that follows a decoding process.

86. The system according to claim 69 wherein the decoder is configured to perform at least two decoding processes and to determine whether to skip at least one decoding process that follows a decoding process if at least one decoding process that preceded the determination provided a result of a desired characteristic.

87. The system according to claim 69 wherein the decoder is configured to ignore the results of an ignored decoding process and to apply a next decoding process on a folded version of each result of a decoding process that preceded the ignored decoding process.

88. The system according to claim 69 wherein the decoder is configured to prevent a modification of at least one bit of a result by at least one decoding process if the decoder determines, by applying at least one preceding decoding process that the at least one bit is correct.

89. The system according to claim 69 wherein the decoder is configured to perform an error location search of a decoding process in response to error locations that were found during a previous decoding process.

90. The system according to claim 69 wherein the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit based upon multiple indications associated with the information bit.

91. The system according to claim 69 wherein the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit based upon a majority of indications associated with the information bit.

92. The system according to claim 69 wherein the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit if at least a predetermined number of indications associated with the information bit indicate that the bit is not correct.

93. The system according to claim 69 wherein the decoder is configured to generate, for each information bit out of multiple information bits, multiple indications about a correctness of the information bit, wherein the decoder is configured to generate the multiple indications by applying multiple decoding processes out of a group of information bits; and wherein the decoder is configured to determine whether to modify each information bit based upon confidence levels of different indications associated with the information bit.

94. The system according to claim 69 wherein each decoding process is characterized by correction threshold; wherein the decoder is configured to prevent a modification of information bits if a decoding process indicates that errors occurred in more information bits than the correction threshold of the decoding process.

95. The system according to claim 69 wherein the decoder is configured to perform multiple iterations of multiple decoding processes.

96. The system according to claim 69 wherein the decoder is configured to perform an iteration of multiple decoding processes while allowing a correction of up to a predefined number of corrections; alter the predefined number of corrections; and perform another iteration of multiple decoding processes while allowing a correction of up to an altered predefined amount of corrections.

97. The system according to claim 69 wherein the decoder is configured to perform multiple iterations of decoding processes to provide multiple decoding iteration results; wherein the decoding iterations differ from each other; and select a selected decoding iteration result out of the multiple decoding iterations results.

98. The system according to claim 69 wherein the decoder is configured to perform a first iteration of decoding processes to provide a first decoding iteration result; and perform a second iteration of second processes if the first decoding iteration result does not satisfy predefined criteria.

99. The system according to claim 69 wherein the decoder is configured to perform a first iteration of decoding processes to provide a first decoding iteration result; and perform a second iteration of second processes if the first decoding iteration failed.

100. The system according to claim 69 wherein the decoder is configured to perform multiple iterations of decoding processes wherein at least one iteration of decoding processes comprises multiple instances of a single decoding process.

101. The method according to claim 1 comprising performing multiple encoding processes in parallel on the folded version of the received data to provide sets of codewords.

102. The method according to claim 1 comprising applying an encoding process on the sets of codewords.

103. The method according to claim 19 comprising performing multiple decoding processes in parallel on a folded version of the information to provide multiple results.

104. A non-transitory computer useable medium that stores instructions that once executed by a processor of the computer cause the processor to perform the steps of: receiving data; generating a set of first codewords by applying a first encoding process on the received data; and performing a second encoding process on a folded version of each first codeword or on a folded version of the received data to provide a set of second codewords, wherein the second codeword comprises redundancy bits.

105. The non-transitory computer usable medium according to claim 104 that stores instructions for storing each first codeword in multiple columns of a memory space; and performing the second encoding process on rows of the memory space.

106. The non-transitory computer usable medium according to claim 104 wherein the first error encoding process differs from the second encoding process.

107. The non-transitory computer usable medium according to claim 104 wherein at least two first codewords have different lengths.

108. The non-transitory computer usable medium according to claim 104 that stores instructions for configuring an error correction capability of at least one of the first and second encoding processes based on a desired error correction capability.

109. The non-transitory computer usable medium according to claim 104 that stores instructions for performing a third encoding process on a folded version of each second codeword to provide a set of third codewords.

110. The non-transitory computer usable medium according to claim 109 wherein the first, second and third error encoding process differ from each other.

111. The non-transitory computer usable medium according to claim 109 wherein at least two codewords out of different sets of codewords have different lengths.

112. The non-transitory computer usable medium according to claim 104 wherein at least two codewords of the same set of codeword have different lengths.

113. The non-transitory computer usable medium according to claim 104 that stores instructions for performing at least four encoding processes, wherein each encoding process except a first encoding process is applied on a folded version of a set of codewords obtained by applying a previous encoding process.

114. The non-transitory computer usable medium according to claim 104 that stores instructions for performing at least three encoding processes, wherein each encoding process except a first encoding process is applied on a folded version of a set of codewords obtained by applying a previous encoding process, wherein at least one encoding process is applied only on redundancy bits generated by previous encoding processes.

115. The non-transitory computer usable medium according to claim 104 that stores instructions for performing at least three encoding processes, wherein each encoding process except a first encoding process is applied on a folded version of a set of codewords obtained by applying a previous encoding process, wherein at least two encoding processes differ from each other.

116. The non-transitory computer usable medium according to claim 104 that stores instructions for generating the set of first codewords by a first encoder, providing the first codewords to a second encoder, and performing a second encoding process by a second encoder; wherein the second encoder starts to perform the second encoding process before the first encoder finished to generate a sub-set of the first codewords.

117. The non-transitory computer usable medium according to claim 116 that stores instructions for generating the set of first codewords by a first linear feedback shift register of the first encoder, providing first codeword chunks to a second liner feedback shift register of the second encoder, and performing a second encoding process by a second encoder.

118. The non-transitory computer usable medium according to claim 104 wherein each first codeword is arranged in a set of consecutive columns of a matrix; wherein non-transitory computer usable medium stores instructions for filling registers that correspond to rows of the matrix and performing the second encoding process on rows of the matrix.

119. The non-transitory computer usable medium according to claim 104 that stores instructions for generating the set of first codewords by a first encoder, wherein a folded version of a first codeword is arranged in a set of consecutive columns of a matrix; filling registers of a second encoder, wherein the registers correspond to rows of the matrix and performing the second decoding process on rows of the matrix by the second encoder.

120. The non-transitory computer usable medium according to claim 104 that stores instructions for configuring configurable linear feedback shift registers according to an encoding parameter of an encoding process selected from the first and second encoding processes.

121. The non-transitory computer usable medium according to claim 104 that stores instructions for storing the set of second codewords in a flash memory; reading a content of the flash memory; and applying a decoding process on the content of the flash memory.

122. A non-transitory computer useable medium that stores instructions that once executed by a processor of the computer cause the processor to perform the steps of: receiving information that comprises a final set of codewords that undergone an error inducing process; reconstructing data by applying on the information a first decoding process to provide first results; and applying a second decoding process on folded versions of first results or on folded versions of the information to provide second results.

123. The non-transitory computer usable medium according to claim 122 that stores instructions for storing each first result in multiple columns of a memory space; and performing the second decoding process on rows of the memory space.

124. The non-transitory computer usable medium according to claim 122 wherein the first error encoding process differs from the second encoding process.

125. The non-transitory computer usable medium according to claim 122 wherein at least two first results have different lengths.

126. The non-transitory computer usable medium according to claim 122 that stores instructions for configuring an error correction capability of at least one of the first and second decoding processes based on a desired error correction capability.

127. The non-transitory computer usable medium according to claim 122 that stores instructions for performing a third decoding process on a folded version of each second result to provide a set of third results.

128. The non-transitory computer usable medium according to claim 127 wherein the first, second and third error decoding process differ from each other.

129. The non-transitory computer usable medium according to claim 127 wherein at least two results out of different sets of results have different lengths.

130. The non-transitory computer usable medium according to claim 122 wherein at least two results of the same set of result have different lengths.

131. The non-transitory computer usable medium according to claim 122 that stores instructions for performing at least four decoding processes, wherein each decoding process except a first decoding process is applied on a folded version of a set of results obtained by applying a previous decoding process.

132. The non-transitory computer usable medium according to claim 122 that stores instructions for performing at least three decoding processes, wherein each decoding process except a first decoding process is applied on a folded version of a set of results obtained by applying a previous decoding process, wherein at least one decoding process is applied only on redundancy bits generated by previous decoding processes.

133. The non-transitory computer usable medium according to claim 122 that stores instructions for performing at least three decoding processes, wherein each decoding process except a first decoding process is applied on a folded version of a set of results obtained by applying a previous decoding process, wherein at least two decoding processes differ from each other.

134. The non-transitory computer usable medium according to claim 122 that stores instructions for performing at least two decoding processes, wherein at least one decoding process is followed by determining whether to ignore the results of the decoding process.

135. The non-transitory computer usable medium according to claim 134 that stores instructions for ignoring the results of an ignored decoding process by applying a next decoding process on a folded version of each result of a decoding process that preceded the ignored decoding process.

136. The non-transitory computer usable medium according to claim 134 that stores instructions for determining to ignore the results of the decoding process if detecting a miss correction.

137. The non-transitory computer usable medium according to claim 134 that stores instructions for ignoring the results of the first decoding process by applying the second decoding process on a folded version of the information.

138. The non-transitory computer usable medium according to claim 122 that stores instructions for performing at least two decoding processes, wherein at least one decoding process is followed by determining whether to skip at least one decoding process that follows the decoding process.

139. The non-transitory computer usable medium according to claim 122 that stores instructions for determining to skip at least one decoding process if at least one decoding process that preceded the determination provided a result of a desired characteristic.

140. The non-transitory computer usable medium according to claim 134 that stores instructions for ignoring the results of an ignored decoding process by applying a next decoding process on a folded version of each result of a decoding process that preceded the ignored decoding process.

141. The non-transitory computer usable medium according to claim 122 that stores instructions for preventing a modification of at least one bit of a result by at least one decoding process if determining by at least one preceding decoding process that the at least one bit is correct.

142. The non-transitory computer usable medium according to claim 122 that stores instructions for performing an error location search of a decoding process in response to error locations that were found during a previous decoding process.

143. The non-transitory computer usable medium according to claim 122 that stores instructions for generating, for each information bit out of multiple information bits, multiple indications about a correctness of the information bit, wherein the generating comprises applying multiple decoding processes out of a group of information bits; and determining whether to modify each information bit based upon multiple indications associated with the information bit.

144. The non-transitory computer usable medium according to claim 122 that stores instructions for generating, for each information bit out of multiple information bits, multiple indications about a correctness of the information bit, wherein the generating comprises applying multiple decoding processes out of a group of information bits; and determining whether to modify each information bit based upon a majority of indications associated with the information bit.

145. The non-transitory computer usable medium according to claim 122 that stores instructions for generating, for each information bit out of multiple information bits, multiple indications about a correctness of the information bit, wherein the generating comprises applying multiple decoding processes out of a group of information bits; and determining to modify each information bit if at least a predetermined number of indications associated with the information bit indicate that the bit is not correct.

146. The non-transitory computer usable medium according to claim 122 that stores instructions for generating, for each information bit out of multiple information bits, multiple indications about a correctness of the information bit, wherein the generating comprises applying multiple decoding processes out of a group of information bits; and determining whether to modify each information bit based upon confidence levels of different indications associated with the information bit.

147. The non-transitory computer usable medium according to claim 122 wherein each decoding process is characterized by correction threshold; wherein non-transitory computer usable medium stores instructions for preventing a modification of information bits if a decoding process indicates that errors occurred in more information bits than the correction threshold of the decoding process.

148. The non-transitory computer usable medium according to claim 122 that stores instructions for performing multiple iterations of multiple decoding processes.

149. The non-transitory computer usable medium according to claim 122 that stores instructions for performing an iteration of multiple decoding processes while allowing a correction of up to a predefined number of corrections; altering the predefined number of corrections; and performing another iteration of multiple decoding processes while allowing a correction of up to an altered predefined amount of corrections.

150. The non-transitory computer usable medium according to claim 122 that stores instructions for performing multiple iterations of decoding processes to provide multiple decoding iteration results; wherein the decoding iterations differ from each other; and selecting a selected decoding iteration result out of the multiple decoding iterations results.

151. The non-transitory computer usable medium according to claim 122 that stores instructions for performing a first iteration of decoding processes to provide a first decoding iteration result; and performing a second iteration of second processes if the first decoding iteration result does not satisfy a predefined criteria.

152. The non-transitory computer usable medium according to claim 122 that stores instructions for performing a first iteration of decoding processes to provide a first decoding iteration result; and performing a second iteration of second processes if the first decoding iteration failed.

153. The non-transitory computer usable medium according to claim 122 that stores instructions for performing multiple iterations of decoding processes wherein at least one iteration of decoding processes comprises multiple instances of a single decoding process.

* * * * *